(12) United States Patent
Schouhamer Immink

(10) Patent No.: US 6,639,524 B2
(45) Date of Patent: Oct. 28, 2003

(54) METHOD AND APPARATUS FOR CODING INFORMATION, METHOD AND APPARATUS FOR DECODING CODED INFORMATION, METHOD OF FABRICATING A RECORDING MEDIUM, THE RECORDING MEDIUM AND MODULATED SIGNAL

(75) Inventor: Kees A. Schouhamer Immink, Geldrop (NL)

(73) Assignee: LG Electronics Inc., Seoul (KR)

( * ) Notice: Subject to any disclaimer, the term of this patent is extended or adjusted under 35 U.S.C. 154(b) by 321 days.

(21) Appl. No.: 09/813,969

(22) Filed: Mar. 22, 2001

(65) Prior Publication Data

US 2001/0030933 A1 Oct. 18, 2001

(30) Foreign Application Priority Data

Mar. 22, 2000 (EP) .............................................. 00201052

(51) Int. Cl.$^7$ .......................... H03M 7/00; G06F 13/12; G11B 20/00
(52) U.S. Cl. ......................... 341/51; 341/59; 341/106; 710/66; 710/68
(58) Field of Search .............................. 710/65, 66, 70, 710/68; 360/39, 55; 341/95, 58, 52, 59, 106; 714/758, 755

(56) References Cited

U.S. PATENT DOCUMENTS

| | | | | |
|---|---|---|---|---|
| 4,115,768 A | * | 9/1978 | Eggenberger et al. | |
| 4,410,877 A | * | 10/1983 | Carrasso et al. | |
| 4,517,552 A | * | 5/1985 | Shirota et al. | |
| 5,696,505 A | * | 12/1997 | Schouhamer et al. | |
| 6,084,356 A | * | 7/2000 | Arts | |

FOREIGN PATENT DOCUMENTS

EP 0745254 B1 * 4/1998 ........... G11B/20/00

* cited by examiner

Primary Examiner—Kim Huynh
(74) Attorney, Agent, or Firm—Birch, Stewart, Kolasch & Birch, LLP

(57) ABSTRACT

A coding device and method in which m-bit information words are converted into n-bit code words such that the coding rate m/n is greater than ½. The coding device and method are also employed to record information on a recording medium and to transmit information. In the decoding method and apparatus, n-bit code words are decoded into m-bit information words. The decoding involves determining the state of a next n-bit code word, and based on the state determination, the current n-bit code word is converted into an m-bit information word. The decoding device and method are employed to reproduce information from a recording medium, and to receive information transmitted over a medium.

53 Claims, 18 Drawing Sheets

FIG. 1
BACKGROUND ART

| k | C(2,k) |
|---|---|
| 7 | 0.5174 |
| 8 | 0.5293 |
| 9 | 0.5369 |
| INFINITE | 0.5515 |

FIG. 2

| SUBGROUP | 1st KIND | | | | 2nd KIND | | | 3rd KIND | |
|---|---|---|---|---|---|---|---|---|---|
| | STATE 1 | STATE 2 | STATE 3 | STATE 4 | STATE 5 | STATE 6 | STATE 7 | STATE 8 | STATE 9 |
| E0000 | 6 | 4 | 4 | 4 | 0 | 0 | 0 | 0 | 0 |
| E0010 | 1 | 2 | 2 | 4 | 0 | 0 | 0 | 0 | 0 |
| E0001 | 1 | 4 | 4 | 1 | 0 | 0 | 1 | 0 | 0 |
| E1000 | 0 | 0 | 0 | 0 | 4 | 4 | 5 | 0 | 0 |
| E1010 | 0 | 0 | 0 | 0 | 2 | 2 | 2 | 0 | 0 |
| E1001 | 0 | 0 | 0 | 0 | 4 | 4 | 1 | 0 | 0 |
| E0100 | 0 | 0 | 0 | 0 | 0 | 0 | 0 | 4 | 5 |
| E0110 | 0 | 0 | 0 | 0 | 0 | 0 | 0 | 2 | 2 |
| E0101 | 0 | 0 | 0 | 0 | 0 | 0 | 0 | 4 | 2 |

FIG. 4A

| Data | State 1 Channel bits | state | State 2 Channel bits | state | State 3 Channel bits | state | State 4 Channel bits | state | State 5 Channel bits | state | State 6 Channel bits | state | State 7 Channel bits | state | State 8 Channel bits | state | State 9 Channel bits | state |
|---|---|---|---|---|---|---|---|---|---|---|---|---|---|---|---|---|---|---|
| 0 | 00000000100 | 1 | 00001000100 | 1 | 00010001000 | 1 | 00100001000 | 1 | 10001001000 | 1 | 10001000000 | 1 | 10010010001 | 4 | 01000100000 | 1 | 01001001001 | 4 |
| 1 | 00000000100 | 2 | 00001000100 | 2 | 00010001000 | 2 | 00100001000 | 2 | 10001001000 | 2 | 10001000000 | 2 | 10000000000 | 2 | 01000100000 | 2 | 01000000000 | 2 |
| 2 | 00000001000 | 3 | 00001000100 | 3 | 00010001000 | 3 | 00100001000 | 3 | 10001001000 | 3 | 10001000000 | 3 | 10000000000 | 3 | 01000100000 | 3 | 01000000000 | 3 |
| 3 | 00000001000 | 4 | 00001000100 | 4 | 00010001000 | 4 | 00100001000 | 4 | 10001001000 | 4 | 10001000000 | 4 | 10000000000 | 4 | 01000100000 | 4 | 01000000000 | 4 |
| 4 | 00000001000 | 5 | 00001000100 | 5 | 00010001000 | 5 | 00100001000 | 5 | 10001001000 | 5 | 10001000000 | 5 | 10000000000 | 5 | 01000100000 | 5 | 01000000000 | 5 |
| 5 | 00000001000 | 6 | 00001000100 | 6 | 00010001000 | 6 | 00100001000 | 6 | 10001001000 | 6 | 10001000000 | 6 | 10000000000 | 6 | 01000100000 | 6 | 01000000000 | 6 |
| 6 | 00000001000 | 7 | 00001000100 | 7 | 00010001000 | 7 | 00100001000 | 7 | 10001001000 | 7 | 10001000000 | 7 | 10000000000 | 7 | 01000100000 | 7 | 01000000000 | 7 |
| 7 | 00000001000 | 8 | 00001000100 | 8 | 00010001000 | 8 | 00100001000 | 8 | 10001001000 | 8 | 10001000000 | 8 | 10000000000 | 8 | 01000100000 | 8 | 01000000000 | 8 |
| 8 | 00000001000 | 9 | 00001000100 | 9 | 00010001000 | 9 | 00100001000 | 9 | 10001001000 | 9 | 10001000000 | 9 | 10000000000 | 9 | 01000100000 | 9 | 01000000000 | 9 |
| 9 | 00000001000 | 1 | 00001001000 | 1 | 00010010000 | 1 | 00100010000 | 1 | 10000000100 | 1 | 10000100100 | 1 | 10000000100 | 1 | 01000000100 | 1 | 01000100100 | 1 |
| 10 | 00000010000 | 2 | 00001001000 | 2 | 00010010000 | 2 | 00100010000 | 2 | 10000000100 | 2 | 10000100100 | 2 | 10000000100 | 2 | 01000000100 | 2 | 01000100100 | 2 |
| 11 | 00000010000 | 3 | 00001001000 | 3 | 00010010000 | 3 | 00100010000 | 3 | 10000000100 | 3 | 10000100100 | 3 | 10000000100 | 3 | 01000000100 | 3 | 01000100100 | 3 |
| 12 | 00000010000 | 4 | 00001001000 | 4 | 00010010000 | 4 | 00100010000 | 4 | 10000000100 | 4 | 10000100100 | 4 | 10000000100 | 4 | 01000000100 | 4 | 01000100100 | 4 |
| 13 | 00000010000 | 5 | 00001001000 | 5 | 00010010000 | 5 | 00100010000 | 5 | 10000000100 | 5 | 10000100100 | 5 | 10000000100 | 5 | 01000000100 | 5 | 01000100100 | 5 |
| 14 | 00000010000 | 6 | 00001001000 | 6 | 00010010000 | 6 | 00100010000 | 6 | 10000000100 | 6 | 10000100100 | 6 | 10000000100 | 6 | 01000000100 | 6 | 01000100100 | 6 |
| 15 | 00000010000 | 7 | 00001001000 | 7 | 00010010000 | 7 | 00100010000 | 7 | 10000000100 | 7 | 10000100100 | 7 | 10000000100 | 7 | 01000000100 | 7 | 01000100100 | 7 |
| 16 | 00000010000 | 8 | 00001001000 | 8 | 00010010000 | 8 | 00100010000 | 8 | 10000000100 | 8 | 10000100100 | 8 | 10000000100 | 8 | 01000000100 | 8 | 01000100100 | 8 |
| 17 | 00000010000 | 9 | 00001001000 | 9 | 00010010000 | 9 | 00100010000 | 9 | 10000000100 | 9 | 10000100100 | 9 | 10000000100 | 9 | 01000000100 | 9 | 01000100100 | 9 |
| 18 | 00000010000 | 1 | 00010100000 | 1 | 00100100001 | 1 | 00100100001 | 1 | 10000001000 | 1 | 10000001000 | 1 | 10000001000 | 1 | 01000001000 | 1 | 01000001000 | 1 |
| 19 | 00000010000 | 2 | 00010000000 | 2 | 00100000000 | 2 | 00100000000 | 2 | 10000001000 | 2 | 10000001000 | 2 | 10000001000 | 2 | 01000001000 | 2 | 01000001000 | 2 |
| 20 | 00000010000 | 3 | 00010000000 | 3 | 00100000000 | 3 | 00100000000 | 3 | 10000001000 | 3 | 10000001000 | 3 | 10000001000 | 3 | 01000001000 | 3 | 01000001000 | 3 |
| 21 | 00000010000 | 4 | 00010000000 | 4 | 00100000000 | 4 | 00100000000 | 4 | 10000001000 | 4 | 10000001000 | 4 | 10000001000 | 4 | 01000001000 | 4 | 01000001000 | 4 |
| 22 | 00000010000 | 5 | 00010000000 | 5 | 00100000000 | 5 | 00100000000 | 5 | 10000001000 | 5 | 10000001000 | 5 | 10000001000 | 5 | 01000001000 | 5 | 01000001000 | 5 |
| 23 | 00000010000 | 6 | 00010000000 | 6 | 00100000000 | 6 | 00100000000 | 6 | 10000001000 | 6 | 10000001000 | 6 | 10000001000 | 6 | 01000001000 | 6 | 01000001000 | 6 |
| 24 | 00000010000 | 7 | 00010000000 | 7 | 00100000000 | 7 | 00100000000 | 7 | 10000001000 | 7 | 10000001000 | 7 | 10000001000 | 7 | 01000001000 | 7 | 01000001000 | 7 |
| 25 | 00000010000 | 8 | 00010000000 | 8 | 00100000000 | 8 | 00100000000 | 8 | 10000001000 | 8 | 10000001000 | 8 | 10000001000 | 8 | 01000001000 | 8 | 01000001000 | 8 |
| 26 | 00000010000 | 9 | 00010000000 | 9 | 00100000000 | 9 | 00100000000 | 9 | 10000001000 | 9 | 10000001000 | 9 | 10000001000 | 9 | 01000001000 | 9 | 01000001000 | 9 |
| 27 | 00000100000 | 1 | 00010000100 | 1 | 00100000100 | 1 | 00100000100 | 1 | 10000010000 | 1 | 10000010000 | 1 | 10000010000 | 1 | 01000010000 | 1 | 01000010000 | 1 |
| 28 | 00000100000 | 2 | 00010000100 | 2 | 00100000100 | 2 | 00100000100 | 2 | 10000010000 | 2 | 10000010000 | 2 | 10000010000 | 2 | 01000010000 | 2 | 01000010000 | 2 |
| 29 | 00000100000 | 3 | 00010000100 | 3 | 00100000100 | 3 | 00100000100 | 3 | 10000010000 | 3 | 10000010000 | 3 | 10000010000 | 3 | 01000010000 | 3 | 01000010000 | 3 |
| 30 | 00000100000 | 4 | 00010000100 | 4 | 00100000100 | 4 | 00100000100 | 4 | 10000010000 | 4 | 10000010000 | 4 | 10000010000 | 4 | 01000010000 | 4 | 01000010000 | 4 |
| 31 | 00000100000 | 5 | 00010000100 | 5 | 00100000100 | 5 | 00100000100 | 5 | 10000010000 | 5 | 10000010000 | 5 | 10000010000 | 5 | 01000010000 | 5 | 01000010000 | 5 |

FIG. 4B

| Data | State 1 Channel bits state | State 2 Channel bits state | State 3 Channel bits state | State 4 Channel bits state | State 5 Channel bits state | State 6 Channel bits state | State 7 Channel bits state | State 8 Channel bits state | State 9 Channel bits state |
|---|---|---|---|---|---|---|---|---|---|
| 32 | 000001000000 6 | 000100000100 6 | 001000000100 6 | 001001001000 6 | 100000010000 6 | 100001000100 6 | 100100010000 6 | 010000010000 6 | 010010001000 6 |
| 33 | 000001000000 7 | 000100000100 7 | 001000000100 7 | 001001001000 7 | 100000010000 7 | 100001000100 7 | 100100010000 7 | 010000010000 7 | 010010001000 7 |
| 34 | 000001000000 8 | 000100000100 8 | 001000000100 8 | 001001001000 8 | 100000010000 8 | 100001000100 8 | 100100010000 8 | 010000010000 8 | 010010001000 8 |
| 35 | 000001000000 9 | 000100000100 9 | 001000000100 9 | 001001001000 9 | 100000010000 9 | 100001000100 9 | 100100010000 9 | 010000010000 9 | 010010001000 9 |
| 36 | 000001001001 1 | 000000010010 1 | 000010000010 1 | 000100010010 1 | 100000000010 1 | 100001000010 1 | 100100010000 1 | 010000000010 1 | 010010001000 1 |
| 37 | 000001001001 2 | 000000010010 2 | 000010000010 2 | 000100010010 2 | 100000000010 2 | 100001000010 2 | 100100010000 2 | 010000000010 2 | 010010001000 2 |
| 38 | 000001001001 3 | 000000010010 3 | 000010000010 3 | 000100010010 3 | 100000000010 3 | 100001000010 3 | 100100010000 3 | 010000000010 3 | 010010001000 3 |
| 39 | 000001001001 4 | 000000010010 4 | 000010000010 4 | 000100010010 4 | 100000000010 4 | 100001000010 4 | 100100010000 4 | 010000000010 4 | 010010001000 4 |
| 40 | 000001001001 5 | 000000010010 5 | 000010000010 8 | 000100010010 8 | 100000000010 8 | 100001000010 8 | 100100010000 5 | 010000000010 8 | 010010001000 5 |
| 41 | 000001001001 6 | 000000010010 9 | 000010000010 9 | 000100010010 9 | 100000000010 9 | 100001000010 9 | 100100010000 6 | 010000000010 9 | 010010001000 6 |
| 42 | 000001001001 7 | 000000100010 1 | 001000000010 1 | 001001000010 1 | 100000010010 1 | 100001000010 1 | 100100010000 7 | 010000010010 1 | 010010001000 7 |
| 43 | 000001001001 8 | 000000100010 2 | 001000000010 2 | 001001000010 2 | 100000010010 2 | 100001000010 2 | 100100010000 8 | 010000010010 2 | 010010001000 8 |
| 44 | 000001001001 9 | 000000100010 3 | 001000000010 3 | 001001000010 3 | 100000010010 3 | 100001000010 3 | 100100010000 9 | 010000010010 3 | 010010001000 9 |
| 45 | 000001000001 1 | 000010000010 4 | 001000000010 4 | 001001000010 4 | 100000010010 4 | 100001000010 4 | 100100010010 1 | 010000010010 4 | 010000100010 1 |
| 46 | 000001000000 2 | 000010000010 8 | 001000000010 8 | 001001000010 8 | 100000010010 8 | 100001000010 8 | 100100010010 2 | 010000010010 8 | 010000100010 2 |
| 47 | 000010000000 3 | 000010000010 9 | 001000000010 9 | 001001000010 9 | 100000010010 9 | 100001000010 9 | 100100010010 3 | 010000010010 9 | 010000100010 3 |
| 48 | 000010000000 4 | 000000100001 1 | 001000010001 1 | 001001010001 1 | 100000000001 1 | 100001000001 1 | 100100000001 1 | 010000000001 1 | 010000100010 4 |
| 49 | 000010000000 5 | 000010001001 2 | 001000010001 2 | 001001010001 2 | 100000000001 2 | 100001000001 2 | 100100000001 2 | 010000000001 2 | 010000100010 8 |
| 50 | 000010000000 6 | 000010001001 3 | 001000010001 3 | 001001010001 3 | 100000000001 3 | 100001000001 3 | 100100000001 3 | 010000000001 3 | 010000100010 9 |
| 51 | 000010001000 7 | 000000010001 4 | 001000010001 4 | 001001010001 4 | 100000000001 4 | 100001000001 4 | 100100010010 4 | 010000000001 4 | 010000100010 1 |
| 52 | 000010001000 8 | 000000010001 1 | 000100010001 1 | 001001010001 1 | 100000001001 1 | 100010000001 1 | 100100010010 1 | 010000001001 1 | 010000100001 2 |
| 53 | 000010001000 9 | 000000100001 2 | 000100010001 2 | 001001010001 2 | 100000001001 2 | 100010000001 2 | 100100010010 2 | 010000001001 2 | 010001000001 3 |
| 54 | 000000000010 1 | 000010000001 3 | 000100010001 3 | 001001010001 3 | 100000001001 3 | 100010000001 3 | 100100010010 3 | 010000001001 3 | 010001000001 4 |
| 55 | 000000000010 2 | 000000100001 4 | 000100010001 4 | 001001010001 4 | 100000001001 4 | 100010000001 4 | 100100010010 4 | 010000001001 4 | 010001000001 8 |
| 56 | 000000000010 3 | 000000100001 1 | 000100100001 1 | 001001000001 1 | 100000010001 1 | 100010000001 1 | 100100010010 9 | 010000010001 1 | 010001000001 9 |
| 57 | 000000000010 4 | 000001000001 2 | 000100100001 2 | 001001000001 2 | 100001000001 2 | 100010000001 2 | 100100010001 2 | 010000010001 2 | 010001000001 1 |
| 58 | 000000010010 8 | 000001000001 3 | 000100100001 3 | 001001000001 3 | 100001000001 3 | 100010000001 3 | 100100100001 3 | 010000010001 3 | 010001000001 2 |
| 59 | 000000010010 9 | 000001000001 4 | 000100100001 4 | 001001000001 4 | 100001000001 4 | 100010000001 4 | 100100010001 4 | 010000010001 4 | 010001000001 3 |
| 60 | 000000001001 1 | 000010001001 1 | 001000010001 1 | 001001000001 1 | 100010001001 1 | 100100010001 1 | 100100010001 1 | 010000100001 1 | 010001000001 4 |
| 61 | 000000010001 2 | 000010001001 2 | 001000010001 2 | 001001000001 2 | 100010001001 2 | 100100010001 2 | 100100010001 2 | 010001000001 2 | 010010010001 1 |
| 62 | 000000010011 3 | 000010010011 3 | 001000010011 3 | 001001000001 3 | 100010001001 3 | 100100010001 3 | 100100010001 3 | 010001000001 3 | 010001000101 2 |
| 63 | 000000010011 4 | 000001001001 4 | 001000000001 4 | 001001000001 4 | 100010010001 4 | 100100010001 4 | 100100010001 4 | 010001000001 4 | 010010010011 3 |

| INFORMATION WORDS (DECIMAL NOTATION) | STATE | CODE WORDS | NEXT STATE |
|---|---|---|---|
| 000001 (1) | S1 | 00000000100 | S2 |
| 000011 (3) | S2 | 00001000100 | S4 |
| 000101 (5) | S4 | 00100001000 | S6 |
| 001100 (12) | S6 | 10000100100 | S4 |
| 010011 (19) | S4 | 00100100000 | S2 |

| SUBGROUP | 1st KIND | | | | 2nd KIND | | | 3rd KIND | |
|---|---|---|---|---|---|---|---|---|---|
| | STATE 1 | STATE 2 | STATE 3 | STATE 4 | STATE 5 | STATE 6 | STATE 7 | STATE 8 | STATE 9 |
| E0000 | 152 | 152 | 152 | 119 | 0 | 0 | 0 | 0 | 0 |
| E0010 | 65 | 65 | 65 | 5 | 0 | 0 | 60 | 0 | 0 |
| E0001 | 70 | 70 | 70 | 160 | 0 | 0 | 10 | 0 | 0 |
| E1000 | 0 | 0 | 0 | 0 | 152 | 152 | 102 | 0 | 0 |
| E1010 | 0 | 0 | 0 | 0 | 65 | 65 | 59 | 0 | 0 |
| E1001 | 0 | 0 | 0 | 0 | 70 | 70 | 137 | 0 | 0 |
| E0100 | 0 | 0 | 0 | 0 | 0 | 0 | 0 | 152 | 125 |
| E0110 | 0 | 0 | 0 | 0 | 0 | 0 | 0 | 65 | 53 |
| E0101 | 0 | 0 | 0 | 0 | 0 | 0 | 0 | 71 | 119 |

FIG. 13A

| | State 1 | | State 2 | | State 3 | | State 4 | | State 5 | |
|---|---|---|---|---|---|---|---|---|---|---|
| Data | Channel bits | state | Channel bits | state | Channel bits | state | Channel bits | state | Channel bits | state |
| 0 | 00000000000001000000 | 1 | 00000100010000000100 | 1 | 00010000010000100100 | 1 | 00100000100100001000 | 1 | 00100100100100010001 | 1 |
| 1 | 00000000000001000000 | 2 | 00000100010000000100 | 2 | 00010000010000100100 | 2 | 00100000100100001000 | 2 | 10000000000000000000 | 2 |
| 2 | 00000000000001000000 | 3 | 00000100010000000100 | 3 | 00010000010000100100 | 3 | 00100000100100001000 | 3 | 10000000000000000000 | 3 |
| 3 | 00000000000001000000 | 4 | 00000100010000000100 | 4 | 00010000010000100100 | 4 | 00100000100100001000 | 4 | 10000000000000000000 | 4 |
| 4 | 00000000000001000000 | 5 | 00000100010000000100 | 5 | 00010000010000100100 | 5 | 00100000100100001000 | 5 | 10000000000000000000 | 5 |
| 5 | 00000000000001000000 | 6 | 00000100010000000100 | 6 | 00010000010000100100 | 6 | 00100000100100001000 | 6 | 10000000000000000000 | 6 |
| 6 | 00000000000001000000 | 7 | 00000100010000000100 | 7 | 00010000010000100100 | 7 | 00100000100100001000 | 7 | 10000000000000000000 | 7 |
| 7 | 00000000000001000000 | 8 | 00000100010000000100 | 8 | 00010000010000100100 | 8 | 00100000100100001000 | 8 | 10000000000000000000 | 8 |
| 8 | 00000000000001000000 | 9 | 00000100010000000100 | 9 | 00010000010000100100 | 9 | 00100000100100001000 | 9 | 10000000000000000000 | 9 |
| 9 | 00000000000001000100 | 1 | 00000100010000001000 | 1 | 00010000010001000000 | 1 | 00100000100100010000 | 1 | 10000000000000000100 | 1 |
| 10 | 00000000000001001000 | 2 | 00000100010000001000 | 2 | 00010000010001000000 | 2 | 00100000100100010000 | 2 | 10000000000000000100 | 2 |
| 11 | 00000000000001001000 | 3 | 00000100010000001000 | 3 | 00010000010001000000 | 3 | 00100000100100010000 | 3 | 10000000000000000100 | 3 |
| 12 | 00000000000001001000 | 4 | 00000100010000001000 | 4 | 00010000010001000000 | 4 | 00100000100100010000 | 4 | 10000000000000000100 | 4 |
| 13 | 00000000000001001000 | 5 | 00000100010000001000 | 5 | 00010000010001000000 | 5 | 00100000100100010000 | 5 | 10000000000000000100 | 5 |
| 14 | 00000000000001001000 | 6 | 00000100010000001000 | 6 | 00010000010001000000 | 6 | 00100000100100010000 | 6 | 10000000000000000100 | 6 |
| 15 | 00000000000001001000 | 7 | 00000100010000001000 | 7 | 00010000010001000000 | 7 | 00100000100100010000 | 7 | 10000000000000000100 | 7 |
| 16 | 00000000000001001000 | 8 | 00000100010000001000 | 8 | 00010000010001000000 | 8 | 00100000100100010000 | 8 | 10000000000000000100 | 8 |
| 17 | 00000000000001001000 | 9 | 00000100010000001000 | 9 | 00010000010001000000 | 9 | 00100000100100010000 | 9 | 10000000000000000100 | 9 |
| 18 | 00000000000001001000 | 1 | 00000100010000010000 | 1 | 00010000010001000100 | 1 | 00100000100100100000 | 1 | 10000000000000001000 | 1 |
| 19 | 00000000000001001000 | 2 | 00000100010000010000 | 2 | 00010000010001000100 | 2 | 00100000100100100000 | 2 | 10000000000000001000 | 2 |
| 20 | 00000000000001001000 | 3 | 00000100010000010000 | 3 | 00010000010001000100 | 3 | 00100000100100100000 | 3 | 10000000000000001000 | 3 |
| 21 | 00000000000001001000 | 4 | 00000100010000010000 | 4 | 00010000010001000100 | 4 | 00100000100100100000 | 4 | 10000000000000001000 | 4 |
| 22 | 00000000000001001000 | 5 | 00000100010000010000 | 5 | 00010000010001000100 | 5 | 00100000100100100000 | 5 | 10000000000000001000 | 5 |
| 23 | 00000000000001001000 | 6 | 00000100010000010000 | 6 | 00010000010001000100 | 6 | 00100000100100100000 | 6 | 10000000000000001000 | 6 |
| 24 | 00000000000001001000 | 7 | 00000100010000010000 | 7 | 00010000010001000100 | 7 | 00100000100100100000 | 7 | 10000000000000001000 | 7 |
| 25 | 00000000000001001000 | 8 | 00000100010000010000 | 8 | 00010000010001000100 | 8 | 00100000100100100000 | 8 | 10000000000000001000 | 8 |
| 26 | 00000000000001001000 | 9 | 00000100010000010000 | 9 | 00010000010001000100 | 9 | 00100000100100100000 | 9 | 10000000000000001000 | 9 |
| 27 | 00000000000010000000 | 1 | 00000100010000100000 | 1 | 00010000010001001000 | 1 | 00100000100101001000 | 1 | 10000000000000010000 | 1 |
| 28 | 00000000000010000000 | 2 | 00000100010000100000 | 2 | 00010000010001001000 | 2 | 00100000100101001000 | 2 | 10000000000000010000 | 2 |
| 29 | 00000000000010000000 | 3 | 00000100010000100000 | 3 | 00010000010001001000 | 3 | 00100000100101001000 | 3 | 10000000000000010000 | 3 |
| 30 | 00000000000010000000 | 4 | 00000100010000100000 | 4 | 00010000010001001000 | 4 | 00100000100101001000 | 4 | 10000000000000010000 | 4 |
| 31 | 00000000000010000000 | 5 | 00000100010000100000 | 5 | 00010000010001001000 | 5 | 00100000100101001000 | 5 | 10000000000000010000 | 5 |

FIG. 13B

| | State 6 | | | State 7 | | | State 8 | | | State 9 | |
|---|---|---|---|---|---|---|---|---|---|---|---|
| Data | Channel bits | state | | Channel bits | state | | Channel bits | state | | Channel bits | state |
| 0 | 10000100001000100000 | 1 | | 10010000001001001000 | 1 | | 00100100100100001001 | 1 | | 01000100001000100000 | 1 |
| 1 | 10000100001000100000 | 2 | | 10010000001001001000 | 2 | | 01000000000000000000 | 2 | | 01000100001000100000 | 2 |
| 2 | 10000100001000100000 | 3 | | 10010000001001001000 | 3 | | 01000000000000000000 | 3 | | 01000100001000100000 | 3 |
| 3 | 10000100001000100000 | 4 | | 10010000001001001000 | 4 | | 01000000000000000000 | 4 | | 01000100001000100000 | 4 |
| 4 | 10000100001000100000 | 5 | | 10010000001001001000 | 5 | | 01000000000000000000 | 5 | | 01000100001000100000 | 5 |
| 5 | 10000100001000100000 | 6 | | 10010000001001001000 | 6 | | 01000000000000000000 | 6 | | 01000100001000100000 | 6 |
| 6 | 10000100001000100000 | 7 | | 10010000001001001000 | 7 | | 01000000000000000000 | 7 | | 01000100001000100000 | 7 |
| 7 | 10000100001000100000 | 8 | | 10010000001001001000 | 8 | | 01000000000000000000 | 8 | | 01000100001000100000 | 8 |
| 8 | 10000100001000100000 | 9 | | 10010000001001001000 | 9 | | 01000000000000000000 | 9 | | 01000100001000100000 | 9 |
| 9 | 10000100001000100100 | 1 | | 10010000001000000000 | 1 | | 01000000000000000100 | 1 | | 01000100001000100100 | 1 |
| 10 | 10000100001000100100 | 2 | | 10010000001000000000 | 2 | | 01000000000000000100 | 2 | | 01000100001000100100 | 2 |
| 11 | 10000100001000100100 | 3 | | 10010000001000000000 | 3 | | 01000000000000000100 | 3 | | 01000100001000100100 | 3 |
| 12 | 10000100001000100100 | 4 | | 10010000001000000000 | 4 | | 01000000000000000100 | 4 | | 01000100001000100100 | 4 |
| 13 | 10000100001000100100 | 5 | | 10010000001000000000 | 5 | | 01000000000000000100 | 5 | | 01000100001000100100 | 5 |
| 14 | 10000100001000100100 | 6 | | 10010000001000000000 | 6 | | 01000000000000000100 | 6 | | 01000100001000100100 | 6 |
| 15 | 10000100001000100100 | 7 | | 10010000001000000000 | 7 | | 01000000000000000100 | 7 | | 01000100001000100100 | 7 |
| 16 | 10000100001000100100 | 8 | | 10010000001000000000 | 8 | | 01000000000000000100 | 8 | | 01000100001000100100 | 8 |
| 17 | 10000100001000100100 | 9 | | 10010000001000000000 | 9 | | 01000000000000000100 | 9 | | 01000100001000100100 | 9 |
| 18 | 10000100001001000000 | 1 | | 10010000001001000100 | 1 | | 01000000000000001000 | 1 | | 01000100001001000000 | 1 |
| 19 | 10000100001001000000 | 2 | | 10010000001001000100 | 2 | | 01000000000000001000 | 2 | | 01000100001001000000 | 2 |
| 20 | 10000100001001000000 | 3 | | 10010000001001000100 | 3 | | 01000000000000001000 | 3 | | 01000100001001000000 | 3 |
| 21 | 10000100001001000000 | 4 | | 10010000001001000100 | 4 | | 01000000000000001000 | 4 | | 01000100001001000000 | 4 |
| 22 | 10000100001001000000 | 5 | | 10010000001001000100 | 5 | | 01000000000000001000 | 5 | | 01000100001001000000 | 5 |
| 23 | 10000100001001000000 | 6 | | 10010000001001000100 | 6 | | 01000000000000001000 | 6 | | 01000100001001000000 | 6 |
| 24 | 10000100001001000000 | 7 | | 10010000001001000100 | 7 | | 01000000000000001000 | 7 | | 01000100001001000000 | 7 |
| 25 | 10000100001001000000 | 8 | | 10010000001001000100 | 8 | | 01000000000000001000 | 8 | | 01000100001001000000 | 8 |
| 26 | 10000100001001000000 | 9 | | 10010000001001000100 | 9 | | 01000000000000001000 | 9 | | 01000100001001000000 | 9 |
| 27 | 10000100001001000100 | 1 | | 10010000001000001000 | 1 | | 01000000000000010000 | 1 | | 01000100001001000100 | 1 |
| 28 | 10000100001001000100 | 2 | | 10010000001000001000 | 2 | | 01000000000000010000 | 2 | | 01000100001001000100 | 2 |
| 29 | 10000100001001000100 | 3 | | 10010000001000001000 | 3 | | 01000000000000010000 | 3 | | 01000100001001000100 | 3 |
| 30 | 10000100001001000100 | 4 | | 10010000001000001000 | 4 | | 01000000000000010000 | 4 | | 01000100001001000100 | 4 |
| 31 | 10000100001001000100 | 5 | | 10010000001000001000 | 5 | | 01000000000000010000 | 5 | | 01000100001001000100 | 5 |

FIG. 14

| SUBGROUP | 1st KIND | | | | 2nd KIND | | | 3rd KIND | |
|---|---|---|---|---|---|---|---|---|---|
| | STATE 1 | STATE 2 | STATE 3 | STATE 4 | STATE 5 | STATE 6 | STATE 7 | STATE 8 | STATE 9 |
| E0000 | 4 | 4 | 4 | 6 | 0 | 0 | 0 | 0 | 0 |
| E0010 | 2 | 2 | 3 | 1 | 1 | 0 | 0 | 0 | 0 |
| E0001 | 4 | 4 | 3 | 1 | 0 | 0 | 0 | 0 | 0 |
| E1000 | 0 | 0 | 0 | 0 | 5 | 4 | 4 | 0 | 0 |
| E1010 | 0 | 0 | 0 | 0 | 1 | 2 | 3 | 0 | 0 |
| E1001 | 0 | 0 | 0 | 0 | 2 | 4 | 3 | 0 | 0 |
| E0100 | 0 | 0 | 0 | 0 | 0 | 0 | 0 | 5 | 4 |
| E0110 | 0 | 0 | 0 | 0 | 0 | 0 | 0 | 2 | 2 |
| E0101 | 0 | 0 | 0 | 0 | 0 | 0 | 0 | 2 | 4 |

FIG. 15A

| Data | State 1 Channel bits | state | State 2 Channel bits | state | State 3 Channel bits | state | State 4 Channel bits | state | State 5 Channel bits | state | State 6 Channel bits | state | State 7 Channel bits | state | State 8 Channel bits | state | State 9 Channel bits | state |
|---|---|---|---|---|---|---|---|---|---|---|---|---|---|---|---|---|---|---|
| 0 | 0000000100 | 1 | 0000100100 | 1 | 0001000000 | 1 | 0010000100 | 1 | 0010010010 | 1 | 1000100100 | 1 | 1001000000 | 1 | 0100000000 | 2 | 0100100100 | 1 |
| 1 | 0000000100 | 2 | 0000100100 | 2 | 0010000000 | 2 | 0001000100 | 2 | 0100100010 | 2 | 1000100100 | 2 | 1001000000 | 2 | 0100000000 | 3 | 0100100100 | 2 |
| 2 | 0000000100 | 3 | 0000100100 | 3 | 0010000000 | 3 | 0010000100 | 3 | 0100100010 | 3 | 1000100100 | 3 | 1001000000 | 3 | 0100000000 | 4 | 0100100100 | 3 |
| 3 | 0000000100 | 4 | 0000100100 | 4 | 0010000000 | 4 | 0001000100 | 4 | 0010010010 | 4 | 1000100100 | 4 | 1001000000 | 4 | 0100000000 | 5 | 0100100100 | 4 |
| 4 | 0000000100 | 5 | 0000100100 | 5 | 0010000000 | 5 | 0010000100 | 5 | 0100100010 | 5 | 1000100100 | 5 | 1001000000 | 5 | 0100000000 | 6 | 0100100100 | 5 |
| 5 | 0000000100 | 6 | 0000100100 | 6 | 0001000000 | 6 | 0010000100 | 6 | 0100100010 | 8 | 1000100100 | 6 | 1001000000 | 6 | 0100000000 | 7 | 0100100100 | 6 |
| 6 | 0000000100 | 7 | 0000100100 | 7 | 0001000000 | 7 | 0010000100 | 7 | 0100100010 | 9 | 1000100100 | 7 | 1001000000 | 7 | 0100000000 | 8 | 0100100100 | 7 |
| 7 | 0000000100 | 8 | 0000100100 | 8 | 0010000000 | 8 | 0001000100 | 8 | 0100000000 | 2 | 1000100100 | 8 | 1001000000 | 8 | 0100000000 | 9 | 0100100100 | 8 |
| 8 | 0000000100 | 9 | 0000100100 | 9 | 0001000000 | 9 | 0010000100 | 9 | 0100000000 | 3 | 1000100100 | 9 | 1001000000 | 9 | 1000000000 | 1 | 0100100100 | 9 |
| 9 | 0000001000 | 1 | 0000100000 | 1 | 0001000000 | 1 | 0010000100 | 2 | 0100000000 | 4 | 1000010000 | 1 | 1001000100 | 1 | 1000000100 | 2 | 0101000000 | 1 |
| 10 | 0000001000 | 2 | 0000100000 | 2 | 0010000000 | 2 | 0100000100 | 3 | 0100000000 | 5 | 1000010000 | 2 | 1001000100 | 2 | 1000000100 | 3 | 0101000000 | 2 |
| 11 | 0000001000 | 3 | 0000100000 | 3 | 0010000000 | 3 | 0010000100 | 4 | 0100000000 | 6 | 1000010000 | 3 | 1001000100 | 3 | 1000000100 | 4 | 0101000000 | 3 |
| 12 | 0000001000 | 4 | 0000100000 | 4 | 0010000000 | 4 | 0010000100 | 5 | 0100000000 | 7 | 1000010000 | 4 | 1001000100 | 4 | 1000000100 | 5 | 0101000000 | 4 |
| 13 | 0000001000 | 5 | 0000100000 | 5 | 0010000000 | 5 | 0100000100 | 6 | 0100000000 | 8 | 1000010000 | 5 | 1001000100 | 5 | 1000000100 | 6 | 0101000000 | 5 |
| 14 | 0000001000 | 6 | 0000100000 | 6 | 0010000000 | 6 | 0100000100 | 7 | 0100000000 | 9 | 1000010000 | 6 | 1001000100 | 6 | 1000000100 | 7 | 0101000000 | 6 |
| 15 | 0000001000 | 7 | 0000100000 | 7 | 0010000000 | 7 | 0100000100 | 8 | 1000000000 | 1 | 1000010000 | 7 | 1001000100 | 7 | 1000000100 | 8 | 0101000000 | 7 |
| 16 | 0000001000 | 8 | 0000100000 | 8 | 0010000000 | 8 | 0010000100 | 9 | 1000000100 | 2 | 1000010000 | 8 | 1001000100 | 8 | 1000000100 | 9 | 0101000000 | 8 |
| 17 | 0000001000 | 9 | 0000100000 | 9 | 0010001000 | 9 | 0100001000 | 1 | 1000000100 | 3 | 1000010000 | 9 | 1001000100 | 9 | 1000001000 | 1 | 0101000000 | 9 |
| 18 | 0000010000 | 1 | 0000100100 | 1 | 0010001000 | 1 | 0100001000 | 2 | 1000000100 | 4 | 1000100000 | 1 | 1001001000 | 1 | 1000001000 | 2 | 0101001000 | 1 |
| 19 | 0000010000 | 2 | 0000100100 | 2 | 0100001000 | 2 | 0100001000 | 3 | 1000000100 | 5 | 1000100000 | 2 | 1001001000 | 2 | 1000001000 | 3 | 0101001000 | 2 |
| 20 | 0000010000 | 3 | 0000100100 | 3 | 0010001000 | 3 | 0100001000 | 4 | 1000000100 | 6 | 1000100000 | 3 | 1001001000 | 3 | 1000001000 | 4 | 0101001000 | 3 |
| 21 | 0000010000 | 4 | 0000100100 | 4 | 0100001000 | 4 | 0100001000 | 5 | 1000000100 | 7 | 1000100000 | 4 | 1001001000 | 4 | 1000001000 | 5 | 0101001000 | 4 |
| 22 | 0000010000 | 5 | 0000100100 | 5 | 0010001000 | 5 | 0100001000 | 6 | 1000000100 | 8 | 1000100000 | 5 | 1001001000 | 5 | 1000001000 | 6 | 0101001000 | 5 |
| 23 | 0000010000 | 6 | 0000100100 | 6 | 0010001000 | 6 | 0100001000 | 7 | 1000000100 | 9 | 1000100000 | 6 | 1001001000 | 6 | 1000001000 | 7 | 0101001000 | 6 |
| 24 | 0000010000 | 7 | 0000100100 | 7 | 0010001000 | 7 | 0100001000 | 8 | 1000001000 | 1 | 1000100000 | 7 | 1001001000 | 7 | 1000001000 | 8 | 0101001000 | 7 |
| 25 | 0000010000 | 8 | 0000100100 | 8 | 0010001000 | 8 | 0100001000 | 9 | 1000001000 | 2 | 1000100000 | 8 | 1001001000 | 8 | 1000001000 | 9 | 0101001000 | 8 |
| 26 | 0000010000 | 9 | 0000100100 | 9 | 0010010000 | 9 | 0100010000 | 1 | 1000001000 | 3 | 1000100000 | 9 | 1001001000 | 9 | 1000010000 | 1 | 0101001000 | 9 |
| 27 | 0000100000 | 1 | 0000100100 | 1 | 0010010000 | 1 | 0100010000 | 2 | 1000001000 | 4 | 1000100000 | 1 | 1001010000 | 1 | 1000010000 | 2 | 0101010000 | 1 |
| 28 | 0000100000 | 2 | 0000100100 | 2 | 0010010000 | 2 | 0100010000 | 3 | 1000001000 | 5 | 1000100000 | 2 | 1001010000 | 2 | 1000010000 | 3 | 0101010000 | 2 |
| 29 | 0000100000 | 3 | 0000100100 | 3 | 0010010000 | 3 | 0100010000 | 4 | 1000001000 | 6 | 1000100000 | 3 | 1001010000 | 3 | 1000010000 | 4 | 0101010000 | 3 |
| 30 | 0000100000 | 4 | 0000100100 | 4 | 0010010000 | 4 | 0100010000 | 5 | 1000001000 | 7 | 1000100000 | 4 | 1001010000 | 4 | 1000010000 | 5 | 0101010000 | 4 |
| 31 | 0000100000 | 5 | 0000100100 | 5 | 0010010000 | 5 | 0100010000 | 7 | 1000001000 | 5 | 1000100000 | 5 | 1001010000 | 5 | 1000010000 | 6 | 0101010000 | 5 |

FIG. 15B

| Data | State 1 Channel bits | state | State 2 Channel bits | state | State 3 Channel bits | state | State 4 Channel bits | state | State 5 Channel bits | state | State 6 Channel bits | state | State 7 Channel bits | state | State 8 Channel bits | state | State 9 Channel bits | state |
|---|---|---|---|---|---|---|---|---|---|---|---|---|---|---|---|---|---|---|
| 32 | 00000100000 | 6 | 00001001000 | 6 | 00010010000 | 8 | 00100010000 | 6 | 10000010000 | 1 | 11000100000 | 6 | 10010010000 | 7 | 01000010000 | 7 | 01001001000 | 6 |
| 33 | 00000100000 | 7 | 00001001000 | 7 | 00010010000 | 9 | 00100010000 | 7 | 10000010000 | 2 | 10001001000 | 7 | 10010010000 | 8 | 01000010000 | 8 | 01001001000 | 7 |
| 34 | 00000100000 | 8 | 00001001000 | 8 | 00010000010 | 1 | 00100010000 | 8 | 10000010000 | 3 | 10001001000 | 8 | 10010010000 | 9 | 01000010000 | 9 | 01001001000 | 8 |
| 35 | 00000100000 | 9 | 00001001000 | 9 | 00010000010 | 2 | 00100010000 | 9 | 10000010000 | 4 | 10001001000 | 9 | 10001000010 | 1 | 01000100000 | 1 | 01001001000 | 9 |
| 36 | 00000000010 | 1 | 10000100010 | 1 | 00010000010 | 3 | 00100100000 | 1 | 10000010000 | 5 | 10000010010 | 1 | 10001000010 | 2 | 01000100000 | 2 | 01000100010 | 1 |
| 37 | 00000000010 | 2 | 00000100010 | 2 | 00010000010 | 4 | 00100100000 | 2 | 10000010000 | 6 | 10000010010 | 2 | 10001000010 | 3 | 01000100000 | 3 | 01000100010 | 2 |
| 38 | 00000000010 | 3 | 00000100010 | 3 | 00010000010 | 8 | 00100100000 | 3 | 10000010000 | 7 | 10000010010 | 3 | 10001000010 | 4 | 01000100000 | 4 | 01000100010 | 3 |
| 39 | 00000000010 | 4 | 00000100010 | 4 | 00010000010 | 9 | 00100100000 | 4 | 10000010000 | 8 | 10000010010 | 4 | 10001000010 | 8 | 01000100000 | 5 | 01000100010 | 4 |
| 40 | 00000000010 | 8 | 00000100010 | 8 | 00010010010 | 1 | 00100100000 | 5 | 10000010000 | 9 | 10000010010 | 8 | 10001000010 | 9 | 01000100000 | 6 | 01000100010 | 8 |
| 41 | 00000000010 | 9 | 00000100010 | 9 | 00010010010 | 2 | 00100100000 | 6 | 10000100000 | 1 | 10000010010 | 9 | 10010010010 | 1 | 01000100000 | 7 | 01000100010 | 9 |
| 42 | 00000010010 | 1 | 10000100010 | 1 | 00010010010 | 3 | 00100100000 | 7 | 10000100000 | 2 | 10000100010 | 1 | 10010010010 | 2 | 01000100000 | 8 | 01000100010 | 1 |
| 43 | 00000010010 | 2 | 00000100010 | 2 | 00010010010 | 4 | 00100100000 | 8 | 10000100000 | 3 | 10000100010 | 2 | 10010010010 | 3 | 01000100000 | 9 | 01000100010 | 2 |
| 44 | 00000010010 | 3 | 00000100010 | 3 | 00010010010 | 8 | 00100100000 | 9 | 10000100000 | 4 | 10000100010 | 3 | 10010010010 | 4 | 01000000010 | 1 | 01000100010 | 3 |
| 45 | 00000010010 | 4 | 00000100010 | 4 | 00010010010 | 9 | 00100100100 | 1 | 10000100000 | 5 | 10000100010 | 4 | 10010010010 | 8 | 01000000010 | 2 | 01000100010 | 4 |
| 46 | 00000010010 | 8 | 00000100010 | 8 | 00010000010 | 1 | 00100100100 | 2 | 10000100000 | 6 | 10000100010 | 8 | 10010010010 | 9 | 01000000010 | 3 | 01000100010 | 8 |
| 47 | 00000010010 | 9 | 00000100010 | 9 | 00010000010 | 2 | 00100100100 | 3 | 10000100000 | 7 | 10000100010 | 9 | 10010010010 | 1 | 01000000010 | 4 | 01000100010 | 9 |
| 48 | 00000001001 | 1 | 10000100010 | 1 | 10000010010 | 1 | 00100000010 | 4 | 10000100000 | 8 | 10000100010 | 1 | 10010010010 | 2 | 01000000010 | 8 | 01000010001 | 1 |
| 49 | 00000001001 | 2 | 10000100010 | 2 | 10000010010 | 2 | 00100000010 | 8 | 10000100000 | 9 | 10000100010 | 2 | 10010010010 | 3 | 01000000010 | 9 | 01000010001 | 2 |
| 50 | 00000001001 | 3 | 10000100010 | 3 | 10000010010 | 3 | 00100000010 | 9 | 10000000010 | 1 | 10000100010 | 3 | 10010010010 | 4 | 01000010010 | 1 | 01000010001 | 3 |
| 51 | 00000001001 | 4 | 10000100010 | 4 | 10000010010 | 4 | 00100100100 | 1 | 10000000010 | 2 | 10000100010 | 4 | 10010010010 | 8 | 01000010010 | 2 | 01000010001 | 4 |
| 52 | 00000010001 | 1 | 10000100010 | 1 | 10000010010 | 1 | 00100100100 | 2 | 10000000010 | 3 | 10000100010 | 1 | 10010010010 | 9 | 01000010010 | 3 | 01000100001 | 1 |
| 53 | 00000010001 | 2 | 10000100010 | 2 | 10000010010 | 2 | 00100100100 | 3 | 10000000010 | 4 | 10000100010 | 2 | 10010010010 | 1 | 01000010010 | 4 | 01000100001 | 2 |
| 54 | 00000010001 | 3 | 10000100010 | 3 | 10000010010 | 3 | 00100100100 | 4 | 10000000010 | 8 | 10000100010 | 3 | 10010010010 | 2 | 01000010010 | 8 | 01000100001 | 3 |
| 55 | 00000010001 | 4 | 10000100010 | 4 | 10000010010 | 4 | 00100100100 | 5 | 10000000010 | 9 | 10000100010 | 4 | 10010010010 | 3 | 01000010010 | 9 | 01000100001 | 4 |
| 56 | 00000100001 | 1 | 10000100010 | 1 | 10000010001 | 1 | 00100000100 | 1 | 10000000001 | 1 | 10000100001 | 1 | 10010000001 | 1 | 01000000001 | 1 | 01001000001 | 1 |
| 57 | 00000100001 | 2 | 10000100010 | 2 | 10000010001 | 2 | 00100000100 | 2 | 10000000001 | 2 | 10000100001 | 2 | 10010000001 | 2 | 01000000001 | 2 | 01001000001 | 2 |
| 58 | 00000100001 | 3 | 10000100010 | 3 | 10000010001 | 3 | 00100000100 | 3 | 10000000001 | 3 | 10000100001 | 3 | 10010000001 | 3 | 01000000001 | 3 | 01001000001 | 3 |
| 59 | 00000100001 | 4 | 10000100010 | 4 | 10000010001 | 4 | 00100000100 | 4 | 10000000001 | 4 | 10000100001 | 4 | 10010000001 | 4 | 01000000001 | 4 | 01001000001 | 4 |
| 60 | 00001000001 | 1 | 10000100010 | 1 | 10000100001 | 1 | 00100010001 | 1 | 10000001001 | 1 | 10001001001 | 1 | 10010010001 | 1 | 01000010001 | 1 | 01001000001 | 1 |
| 61 | 00001000001 | 2 | 10000100010 | 2 | 10000100001 | 2 | 00100010001 | 2 | 10000001001 | 2 | 10001001001 | 2 | 10010010001 | 2 | 01000010001 | 2 | 01001001001 | 2 |
| 62 | 00001000001 | 3 | 10000100010 | 3 | 10000100001 | 3 | 00100010001 | 3 | 10000001001 | 3 | 10001001001 | 3 | 10010010001 | 3 | 01000010001 | 3 | 01001001001 | 3 |
| 63 | 00001000001 | 4 | 10000100010 | 4 | 10000100001 | 4 | 00100010001 | 4 | 10000001001 | 4 | 10001001001 | 4 | 10010010001 | 4 | 01000010001 | 4 | 01001001001 | 4 |

FIG. 16

| SUBGROUP | 1st KIND | | | | 2nd KIND | | | 3rd KIND | |
|---|---|---|---|---|---|---|---|---|---|
| | STATE 1 | STATE 2 | STATE 3 | STATE 4 | STATE 5 | STATE 6 | STATE 7 | STATE 8 | STATE 9 |
| E0000 | 8 | 8 | 9 | 12 | 0 | 0 | 0 | 0 | 0 |
| E0010 | 6 | 5 | 4 | 2 | 0 | 0 | 0 | 0 | 0 |
| E0001 | 6 | 8 | 8 | 3 | 0 | 0 | 1 | 0 | 0 |
| E1000 | 0 | 0 | 0 | 0 | 11 | 9 | 7 | 0 | 0 |
| E1010 | 0 | 0 | 0 | 0 | 5 | 3 | 5 | 0 | 0 |
| E1001 | 0 | 0 | 0 | 0 | 1 | 9 | 9 | 0 | 0 |
| E0100 | 0 | 0 | 0 | 0 | 0 | 0 | 0 | 11 | 8 |
| E0110 | 0 | 0 | 0 | 0 | 0 | 0 | 0 | 5 | 4 |
| E0101 | 0 | 0 | 0 | 0 | 0 | 0 | 1 | 3 | 9 |

| Data | State 1 Channel bits | state | State 2 Channel bits | state | State 3 Channel bits | state | State 4 Channel bits | state | State 5 Channel bits | state | State 6 Channel bits | state | State 7 Channel bits | state | State 8 Channel bits | state | State 9 Channel bits | state |
|---|---|---|---|---|---|---|---|---|---|---|---|---|---|---|---|---|---|---|
| 32 | 0000001000100 | 8 | 0000100001000 | 8 | 0001000100000 | 7 | 0010000100000 | 7 | 1000000100000 | 7 | 1000100001000 | 8 | 1001000100100 | 7 | 0100000100000 | 4 | 0100100000100 | 8 |
| 33 | 0000001000100 | 9 | 0000100001000 | 9 | 0001000100000 | 8 | 0010000100000 | 8 | 1000000100000 | 8 | 1000100001000 | 9 | 1001000100100 | 8 | 0100000100000 | 5 | 0100100000100 | 9 |
| 34 | 0000001001000 | 1 | 0000100010000 | 1 | 0001000100000 | 9 | 0010000100000 | 9 | 1000000100000 | 9 | 1000100010000 | 1 | 1001000100100 | 9 | 0100000100000 | 6 | 0100100000100 | 1 |
| 35 | 0000001001000 | 2 | 0000100010000 | 2 | 0001000100100 | 1 | 0010000100100 | 1 | 1000000100100 | 1 | 1000100010000 | 2 | 1001001000000 | 2 | 0100000100000 | 7 | 0100100001000 | 2 |
| 36 | 0000001001000 | 3 | 0000100010000 | 3 | 0001000100100 | 2 | 0010000100100 | 2 | 1000000100100 | 2 | 1000100010000 | 3 | 1001001000000 | 3 | 0100000100000 | 8 | 0100100001000 | 3 |
| 37 | 0000001001000 | 4 | 0000100010000 | 4 | 0001000100100 | 3 | 0010000100100 | 3 | 1000000100100 | 3 | 1000100010000 | 4 | 1001001000000 | 4 | 0100000100000 | 9 | 0100100001000 | 4 |
| 38 | 0000001001000 | 5 | 0000100010000 | 5 | 0001000100100 | 4 | 0010000100100 | 4 | 1000000100100 | 4 | 1000100010000 | 5 | 1001001000000 | 5 | 0100000100100 | 1 | 0100100001000 | 5 |
| 39 | 0000001001000 | 6 | 0000100010000 | 6 | 0001000100100 | 5 | 0010000100100 | 5 | 1000000100100 | 5 | 1000100010000 | 6 | 1001001000000 | 6 | 0100000100100 | 2 | 0100100001000 | 6 |
| 40 | 0000001001000 | 7 | 0000100010000 | 7 | 0001000100100 | 6 | 0010000100100 | 6 | 1000000100100 | 6 | 1000100010000 | 7 | 1001001000000 | 7 | 0100000100100 | 3 | 0100100001000 | 7 |
| 41 | 0000001001000 | 8 | 0000100010000 | 8 | 0001000100100 | 7 | 0010000100100 | 7 | 1000000100100 | 7 | 1000100010000 | 8 | 1001001000000 | 8 | 0100000100100 | 4 | 0100100001000 | 8 |
| 42 | 0000001001000 | 9 | 0000100010000 | 9 | 0001000100100 | 8 | 0010000100100 | 8 | 1000000100100 | 8 | 1000100010000 | 9 | 1001001000000 | 9 | 0100000100100 | 5 | 0100100001000 | 9 |
| 43 | 0000010000000 | 2 | 0000100100000 | 2 | 0001000100100 | 9 | 0010000100100 | 9 | 1000000100100 | 9 | 1000100100000 | 2 | 1001001000100 | 1 | 0100000100100 | 6 | 0100100010000 | 1 |
| 44 | 0000010000000 | 3 | 0000100100000 | 3 | 0001001000000 | 2 | 0010001000000 | 2 | 1000001000000 | 2 | 1000100100000 | 3 | 1001001000100 | 2 | 0100000100100 | 7 | 0100100010000 | 2 |
| 45 | 0000010000000 | 4 | 0000100100000 | 4 | 0001001000000 | 3 | 0010001000000 | 3 | 1000001000000 | 3 | 1000100100000 | 4 | 1001001000100 | 3 | 0100000100100 | 8 | 0100100010000 | 3 |
| 46 | 0000010000000 | 5 | 0000100100000 | 5 | 0001001000000 | 4 | 0010001000000 | 4 | 1000001000000 | 4 | 1000100100000 | 5 | 1001001000100 | 4 | 0100000100100 | 9 | 0100100010000 | 4 |
| 47 | 0000010000000 | 6 | 0000100100000 | 6 | 0001001000000 | 5 | 0010001000000 | 5 | 1000001000000 | 5 | 1000100100000 | 6 | 1001001000100 | 5 | 0100001000000 | 2 | 0100100010000 | 5 |
| 48 | 0000010000000 | 7 | 0000100100000 | 7 | 0001001000000 | 6 | 0010001000000 | 6 | 1000001000000 | 6 | 1000100100000 | 7 | 1001001000100 | 6 | 0100001000000 | 3 | 0100100010000 | 6 |
| 49 | 0000010000000 | 8 | 0000100100000 | 8 | 0001001000000 | 7 | 0010001000000 | 7 | 1000001000000 | 7 | 1000100100000 | 8 | 1001001000100 | 7 | 0100001000000 | 4 | 0100100010000 | 7 |
| 50 | 0000010000100 | 1 | 0000100100000 | 9 | 0001001000000 | 8 | 0010001000000 | 8 | 1000001000000 | 8 | 1000100100000 | 9 | 1001001000100 | 8 | 0100001000000 | 5 | 0100100010000 | 8 |
| 51 | 0000010000100 | 2 | 0000100100100 | 1 | 0001001000000 | 9 | 0010001000000 | 9 | 1000001000000 | 9 | 1000100100100 | 1 | 1001001000100 | 9 | 0100001000000 | 6 | 0100100010000 | 9 |
| 52 | 0000010000100 | 3 | 0000100100100 | 2 | 0001001000100 | 1 | 0010001000100 | 1 | 1000001000100 | 1 | 1000100100100 | 2 | 1001001001000 | 2 | 0100001000000 | 7 | 0100100100000 | 2 |
| 53 | 0000010000100 | 4 | 0000100100100 | 3 | 0001001000100 | 2 | 0010001000100 | 2 | 1000001000100 | 2 | 1000100100100 | 3 | 1001001001000 | 3 | 0100001000000 | 8 | 0100100100000 | 3 |
| 54 | 0000010000100 | 5 | 0000100100100 | 4 | 0001001000100 | 3 | 0010001000100 | 3 | 1000001000100 | 3 | 1000100100100 | 4 | 1001001001000 | 4 | 0100001000000 | 9 | 0100100100000 | 4 |
| 55 | 0000010000100 | 6 | 0000100100100 | 5 | 0001001000100 | 4 | 0010001000100 | 4 | 1000001000100 | 4 | 1000100100100 | 5 | 1001001001000 | 5 | 0100001000100 | 1 | 0100100100000 | 5 |
| 56 | 0000010000100 | 7 | 0000100100100 | 6 | 0001001000100 | 5 | 0010001000100 | 5 | 1000001000100 | 5 | 1000100100100 | 6 | 1001001001000 | 6 | 0100001000100 | 2 | 0100100100000 | 6 |
| 57 | 0000010000100 | 8 | 0000100100100 | 7 | 0001001000100 | 6 | 0010001000100 | 6 | 1000001000100 | 6 | 1000100100100 | 7 | 1001001001000 | 7 | 0100001000100 | 3 | 0100100100000 | 7 |
| 58 | 0000010000100 | 9 | 0000100100100 | 8 | 0001001000100 | 7 | 0010001000100 | 7 | 1000001000100 | 7 | 1000100100100 | 8 | 1001001001000 | 8 | 0100001000100 | 4 | 0100100100000 | 8 |
| 59 | 0000010001000 | 1 | 0000100100100 | 9 | 0001001000100 | 8 | 0010001000100 | 8 | 1000001000100 | 8 | 1000100100100 | 9 | 1001001001000 | 9 | 0100001000100 | 5 | 0100100100000 | 9 |
| 60 | 0000010001000 | 2 | 0001000000000 | 4 | 0001001000100 | 9 | 0010001000100 | 9 | 1000001000100 | 9 | 1001000000000 | 4 | 1001001001000 | 1 | 0100001000100 | 6 | 0100100100100 | 1 |
| 61 | 0000010001000 | 3 | 0001000000000 | 5 | 0001001001000 | 1 | 0010001001000 | 1 | 1000001001000 | 1 | 1001000000000 | 5 | 1001001001000 | 1 | 0100001000100 | 7 | 0100100100100 | 2 |
| 62 | 0000010001000 | 4 | 0001000000000 | 6 | 0001001001000 | 2 | 0010001001000 | 2 | 1000001001000 | 2 | 1001000000000 | 6 | 1001001001000 | 2 | 0100001000100 | 8 | 0100100100100 | 3 |
| 63 | 0000010001000 | 5 | 0001000000000 | 7 | 0001001001000 | 3 | 0010001001000 | 3 | 1000001001000 | 3 | 1001000000000 | 7 | 1001001001000 | 3 | 0100001000100 | 9 | 0100100100100 | 4 |

FIG. 17C

| Data | State 1 Channel bits | state | State 2 Channel bits | state | State 3 Channel bits | state | State 4 Channel bits | state | State 5 Channel bits | state | State 6 Channel bits | state | State 7 Channel bits | state | State 8 Channel bits | state | State 9 Channel bits | state |
|---|---|---|---|---|---|---|---|---|---|---|---|---|---|---|---|---|---|---|
| 64 | 000001000100 | 6 | 000010000000 | 8 | 000100100100 | 4 | 001001001000 | 4 | 10000100100 | 4 | 100100000000 | 8 | 100010010010 | 4 | 010000100100 | 4 | 010010100100 | 1 |
| 65 | 000001000100 | 7 | 000100000000 | 9 | 000100100100 | 5 | 001001001000 | 5 | 100001001000 | 5 | 100100000000 | 9 | 100010010010 | 8 | 010000100100 | 8 | 010010100100 | 6 |
| 66 | 000001000100 | 8 | 000010010010 | 1 | 000010010010 | 6 | 001001001000 | 6 | 100001001000 | 6 | 100100000000 | 1 | 100010010010 | 9 | 010000100100 | 9 | 010010100100 | 7 |
| 67 | 000010010010 | 9 | 000100100100 | 2 | 000100100100 | 7 | 001001001000 | 7 | 100001001000 | 7 | 100100000000 | 2 | 100010000010 | 1 | 010000100100 | 1 | 010010100100 | 8 |
| 68 | 000001000100 | 1 | 000100100100 | 3 | 000010010010 | 8 | 001001001000 | 8 | 100001001000 | 8 | 100100000000 | 3 | 100010000010 | 2 | 010000100100 | 2 | 010010100100 | 9 |
| 69 | 000001000100 | 2 | 000100100100 | 4 | 000100100100 | 9 | 001001001000 | 9 | 100001001000 | 9 | 100100000000 | 4 | 100010000010 | 3 | 010000100100 | 3 | 010010100100 | 1 |
| 70 | 000001000100 | 3 | 000010010010 | 8 | 000100000000 | 5 | 001001001000 | 3 | 100001000000 | 3 | 100100000000 | 5 | 100010000010 | 4 | 010000100100 | 6 | 010001000010 | 2 |
| 71 | 000001000100 | 4 | 000100100100 | 9 | 000010000000 | 6 | 001001000000 | 4 | 100010000000 | 4 | 100100000000 | 6 | 100010000010 | 8 | 010000100100 | 7 | 010001000010 | 3 |
| 72 | 000001000100 | 8 | 000010010010 | 1 | 000010000000 | 7 | 001001000000 | 5 | 100010000000 | 5 | 100100000000 | 7 | 100010000010 | 9 | 010000100100 | 8 | 010001000010 | 4 |
| 73 | 000001000100 | 9 | 000010000000 | 2 | 000010000000 | 8 | 001001000000 | 6 | 100010000000 | 6 | 100010000000 | 8 | 100010000010 | 1 | 010010100000 | 3 | 010001000010 | 5 |
| 74 | 000010000000 | 1 | 000010000000 | 3 | 000010000000 | 9 | 001001000000 | 7 | 100010000000 | 7 | 100010000000 | 9 | 100010000010 | 2 | 010010100000 | 4 | 010001000010 | 6 |
| 75 | 000010000000 | 2 | 000010000000 | 4 | 000010000000 | 1 | 001001000000 | 8 | 100010000000 | 8 | 100010000000 | 1 | 100010000010 | 3 | 010010100000 | 5 | 010001000010 | 7 |
| 76 | 000010000000 | 3 | 000010000000 | 8 | 000010000000 | 2 | 001001000000 | 9 | 100001000010 | 1 | 100010010010 | 2 | 100010000010 | 4 | 010010000000 | 6 | 010001000010 | 8 |
| 77 | 000010000000 | 4 | 000010000000 | 9 | 000010000000 | 3 | 001001000010 | 1 | 100010000100 | 2 | 100010010010 | 3 | 100010000010 | 8 | 010010000000 | 7 | 010001000010 | 9 |
| 78 | 000010000000 | 8 | 000010000010 | 1 | 000010000000 | 4 | 001001000010 | 2 | 100010000100 | 3 | 100010010010 | 8 | 100010000010 | 9 | 010010000000 | 8 | 010001000010 | 1 |
| 79 | 000010000000 | 9 | 000010000010 | 2 | 000010000000 | 8 | 001001000010 | 3 | 100010000100 | 4 | 100010010010 | 4 | 100010000100 | 1 | 010010000000 | 9 | 010001000010 | 2 |
| 80 | 000010000010 | 1 | 000010000010 | 3 | 000010000010 | 1 | 001001000010 | 4 | 100010000100 | 5 | 100010010010 | 5 | 100010100100 | 2 | 010010000000 | 1 | 010001000010 | 3 |
| 81 | 000010000010 | 2 | 000010000010 | 4 | 000010000010 | 2 | 001001000010 | 8 | 100010000100 | 6 | 100010010010 | 6 | 100010100100 | 3 | 010010000000 | 2 | 010001000010 | 4 |
| 82 | 000010000010 | 3 | 000010000010 | 8 | 000010000010 | 3 | 001001000010 | 9 | 100010000100 | 7 | 100010010010 | 2 | 100010100100 | 4 | 010010000000 | 3 | 010001000010 | 1 |
| 83 | 000010000010 | 4 | 000010000010 | 9 | 000010000010 | 4 | 001001000100 | 1 | 100010000100 | 8 | 100010010010 | 3 | 100010100100 | 8 | 010010000000 | 4 | 010001000010 | 2 |
| 84 | 000010000010 | 8 | 000010000100 | 1 | 000010000010 | 8 | 001001000100 | 2 | 100010000100 | 9 | 100010010010 | 4 | 100010100100 | 9 | 010010000000 | 5 | 010001000010 | 3 |
| 85 | 000010000010 | 9 | 000010000100 | 2 | 000010000010 | 9 | 001001000100 | 3 | 100010000100 | 1 | 100010010010 | 5 | 100010100100 | 1 | 010010000000 | 6 | 010001000010 | 4 |
| 86 | 000010000100 | 1 | 000010000100 | 3 | 000010000100 | 1 | 001001000100 | 4 | 100010000100 | 2 | 100010010010 | 8 | 100010100100 | 2 | 010010000000 | 7 | 010001000010 | 8 |
| 87 | 000010000100 | 2 | 000010000100 | 4 | 000010000100 | 2 | 001001000100 | 8 | 100010000100 | 3 | 100010010010 | 9 | 100010100100 | 3 | 010010000000 | 8 | 010001000010 | 9 |
| 88 | 000010000100 | 3 | 000010000100 | 8 | 000010000100 | 3 | 001001000100 | 9 | 100010000100 | 4 | 100010010010 | 1 | 100010100100 | 4 | 010010000000 | 9 | 010001000010 | 1 |
| 89 | 000010000100 | 4 | 000010000100 | 9 | 000010000100 | 4 | 001001000100 | 5 | 100010000100 | 5 | 100010010010 | 2 | 100010100100 | 5 | 010010000000 | 1 | 010001000010 | 2 |
| 90 | 000010000100 | 8 | 000010010000 | 1 | 000010000100 | 8 | 001001000100 | 6 | 100010000100 | 6 | 100010010010 | 3 | 100010100100 | 6 | 010010000000 | 2 | 010001000010 | 3 |
| 91 | 000010000100 | 9 | 000010010000 | 2 | 000010000100 | 9 | 001001000100 | 7 | 100010000100 | 8 | 100010010010 | 6 | 100010100100 | 7 | 010010000000 | 3 | 010001000010 | 4 |
| 92 | 000010010000 | 1 | 000010010000 | 3 | 000010010000 | 1 | 001001010000 | 8 | 100010010000 | 7 | 100010010010 | 8 | 100010100100 | 1 | 010010000000 | 4 | 010001000010 | 8 |
| 93 | 000010010000 | 2 | 000010010000 | 4 | 000010010000 | 2 | 001001010000 | 9 | 100010010000 | 8 | 100010010010 | 9 | 100010000100 | 2 | 010000000000 | 8 | 010000100010 | 1 |
| 94 | 000010010000 | 3 | 000010010000 | 8 | 000010010000 | 3 | 001001010000 | 1 | 100010010000 | 9 | 100010010010 | 1 | 100010000100 | 3 | 010000000000 | 9 | 010000100010 | 2 |
| 95 | 000010010000 | 4 | 000010010000 | 9 | 000010010000 | 4 | 001001010000 | 2 | 100010010000 | 1 | 100010010010 | 3 | 100010000100 | 1 | 010000000000 | 1 | 010000100010 | 3 |

FIG. 17D

| Data | State 1 Channel bits | state | State 2 Channel bits | state | State 3 Channel bits | state | State 4 Channel bits | state | State 5 Channel bits | state | State 6 Channel bits | state | State 7 Channel bits | state | State 8 Channel bits | state | State 9 Channel bits | state |
|---|---|---|---|---|---|---|---|---|---|---|---|---|---|---|---|---|---|---|
| 96 | 0000100000010 | 8 | 0000100000001 | 1 | 0010001000010 | 4 | 0010010010000 | 2 | 1000000001001 | 2 | 1000000010001 | 4 | 1000100010001 | 2 | 0100000010010 | 2 | 0100001000001 | 4 |
| 97 | 0000100000010 | 9 | 0000100000001 | 2 | 0010001000010 | 8 | 0010010010000 | 3 | 1000000000001 | 3 | 1000000010001 | 1 | 1000100010001 | 3 | 0100000010010 | 3 | 0100001001001 | 1 |
| 98 | 0000100010010 | 1 | 0000100000001 | 3 | 0010001000010 | 9 | 0010010010000 | 4 | 1000000000010 | 4 | 1000000010001 | 2 | 1000100010001 | 4 | 0100000010010 | 4 | 0100001001001 | 2 |
| 99 | 0000100010010 | 2 | 0000100000001 | 4 | 0010001000010 | 1 | 0010010010000 | 5 | 1000000000010 | 8 | 1000000010001 | 3 | 1000100100001 | 1 | 0100000010010 | 8 | 0100001001001 | 3 |
| 100 | 0000100010010 | 3 | 0000100001001 | 1 | 0010010010001 | 2 | 0010010010000 | 6 | 1000000000010 | 9 | 1000000010001 | 4 | 1000100100001 | 2 | 0100000010010 | 9 | 0100001001001 | 4 |
| 101 | 0000100010010 | 4 | 0000100001001 | 2 | 0010010010001 | 3 | 0010010010000 | 7 | 1000000010010 | 1 | 1000010010001 | 1 | 1000100100001 | 3 | 0100000100010 | 1 | 0100001000001 | 1 |
| 102 | 0000100010010 | 8 | 0000100001001 | 3 | 0010010010001 | 4 | 0010010010000 | 8 | 1000000010010 | 2 | 1000010010001 | 2 | 1000100100001 | 4 | 0100000100010 | 2 | 0100001000001 | 2 |
| 103 | 0000100010010 | 9 | 0000100001001 | 4 | 0010010010001 | 1 | 0010010010000 | 9 | 1000000010010 | 3 | 1000010010001 | 3 | 1001000000001 | 3 | 0100000100010 | 3 | 0100001000001 | 3 |
| 104 | 0000000100001 | 1 | 0000100010001 | 1 | 0010010010001 | 2 | 0010010000010 | 1 | 1000000010010 | 4 | 1000010010001 | 4 | 1001000000001 | 2 | 0100000100010 | 4 | 0100001000001 | 4 |
| 105 | 0000000100001 | 2 | 0000100010001 | 2 | 0010010010001 | 3 | 0010010000010 | 2 | 1000010000010 | 8 | 1000010000001 | 3 | 1001000000001 | 1 | 0100000100010 | 8 | 0100001000001 | 8 |
| 106 | 0000000100001 | 3 | 0000100010001 | 3 | 0010010010001 | 4 | 0010010000010 | 3 | 1000010000010 | 9 | 1000010000001 | 4 | 1001000000001 | 2 | 0100000100010 | 9 | 0100001000001 | 9 |
| 107 | 0000000100001 | 4 | 0000100010001 | 4 | 0100000000001 | 1 | 0010010000010 | 4 | 1000010000010 | 1 | 1000010000001 | 1 | 1001000000001 | 3 | 0100001000010 | 2 | 0100001000001 | 1 |
| 108 | 0000001000001 | 1 | 0000100010001 | 1 | 0100000000001 | 2 | 0010010000010 | 8 | 1000010000010 | 2 | 1000010000001 | 2 | 1001000000001 | 4 | 0100001000010 | 3 | 0100001000001 | 2 |
| 109 | 0000001000001 | 2 | 0000100010001 | 2 | 0100000000001 | 3 | 0010010000010 | 9 | 1000010000010 | 3 | 1000010000001 | 3 | 1001000100001 | 1 | 0100001000010 | 4 | 0100001000001 | 3 |
| 110 | 0000001000001 | 3 | 0000100010001 | 3 | 0100000000001 | 4 | 0010010000010 | 1 | 1000010000010 | 4 | 1000010000001 | 4 | 1001000100001 | 2 | 0100001000010 | 8 | 0100001000001 | 4 |
| 111 | 0000001001001 | 1 | 0001000000001 | 4 | 0100000000001 | 1 | 0010010010010 | 2 | 1000010000010 | 1 | 1000010000001 | 1 | 1001000100001 | 3 | 0100001000010 | 9 | 0100001000001 | 1 |
| 112 | 0000001001001 | 2 | 0001000000001 | 1 | 0100000000001 | 2 | 0010010010010 | 3 | 1000010000010 | 2 | 1000010000001 | 2 | 1001000100001 | 4 | 0100010000010 | 1 | 0100001000001 | 2 |
| 113 | 0000001001001 | 3 | 0001000000001 | 2 | 0100000000001 | 3 | 0010010010010 | 4 | 1000010000010 | 3 | 1000010000001 | 3 | 1001000100001 | 1 | 0100010000010 | 2 | 0100001000001 | 3 |
| 114 | 0000001001001 | 4 | 0001000000001 | 3 | 0100000000001 | 4 | 0010010010010 | 1 | 1000010000010 | 4 | 1000010000001 | 4 | 1001000100001 | 2 | 0100010000010 | 3 | 0100001000001 | 4 |
| 115 | 0000001001001 | 1 | 0001000000001 | 4 | 0100000001001 | 1 | 0010010010010 | 8 | 1000010000010 | 8 | 1000010000001 | 1 | 1001000100001 | 3 | 0100010000010 | 4 | 0100001000001 | 1 |
| 116 | 0000001000001 | 2 | 0001000000001 | 1 | 0100000001001 | 2 | 0010010010010 | 9 | 1000010000010 | 9 | 1000010000001 | 2 | 1001000100001 | 4 | 0100010000010 | 8 | 0100001000001 | 2 |
| 117 | 0000001000001 | 3 | 0001000000001 | 2 | 0100000001001 | 3 | 0010010000001 | 1 | 1000010001010 | 1 | 1000010001001 | 4 | 1001000100001 | 1 | 0100010000010 | 9 | 0100001000001 | 3 |
| 118 | 0000001000001 | 4 | 0001000000001 | 3 | 0100000001001 | 4 | 0010010000001 | 2 | 1000010001010 | 2 | 1000010001001 | 1 | 1001000100001 | 2 | 0100010000010 | 1 | 0100001000001 | 4 |
| 119 | 0000001000001 | 1 | 0001000000001 | 4 | 0100000010001 | 1 | 0010010000001 | 3 | 1000010001010 | 3 | 1000010001001 | 2 | 1001001000001 | 3 | 0100010000010 | 2 | 0100001000001 | 2 |
| 120 | 0000001000001 | 2 | 0001000010001 | 1 | 0100000010001 | 2 | 0010010000001 | 4 | 1000010000010 | 4 | 1000010001001 | 3 | 1001001000001 | 4 | 0100000001001 | 1 | 0100001000001 | 3 |
| 121 | 0000001000001 | 3 | 0001000010001 | 2 | 0100000010001 | 3 | 0010010001001 | 2 | 1000010000010 | 8 | 1000010001001 | 4 | 1001001000001 | 1 | 0100000001001 | 2 | 0100001000001 | 4 |
| 122 | 0000001000001 | 4 | 0001000010001 | 3 | 0100000010001 | 4 | 0010010001001 | 3 | 1000010010010 | 4 | 1000100010001 | 1 | 1001001000001 | 2 | 0100000001001 | 3 | 0100001000001 | 1 |
| 123 | 0000001000001 | 1 | 0001000010001 | 4 | 0100000100001 | 1 | 0010010001001 | 4 | 1000010010010 | 8 | 1000100010001 | 2 | 1001001000001 | 3 | 0100000010001 | 4 | 0100001000001 | 2 |
| 124 | 0000010010001 | 2 | 0001000100001 | 1 | 0100000100001 | 2 | 0010010010001 | 1 | 1000010010010 | 9 | 1000101001001 | 3 | 1001001000001 | 4 | 0100000010001 | 1 | 0100001000001 | 3 |
| 125 | 0000010010001 | 3 | 0001000100001 | 2 | 0100000100001 | 3 | 0010010010001 | 2 | 1000010010010 | 1 | 1000101001001 | 4 | 1001001001001 | 1 | 0100000010001 | 2 | 0100001000001 | 4 |
| 126 | 0000010010001 | 4 | 0001000100001 | 3 | 0100000100001 | 4 | 0010010010001 | 3 | 1000010010010 | 2 | 1000100001001 | 1 | 1001001001001 | 2 | 0100000010001 | 4 | 0100001000001 | 2 |
| 127 | 0000010010001 | 1 | 0001000100001 | 4 | 0100000100001 | 1 | 0010010010001 | 4 | 1000010010010 | 3 | 1000100001001 | 2 | 1001001001001 | 3 | 0100000010001 | 1 | 0100001000001 | 3 |

METHOD AND APPARATUS FOR CODING INFORMATION, METHOD AND APPARATUS FOR DECODING CODED INFORMATION, METHOD OF FABRICATING A RECORDING MEDIUM, THE RECORDING MEDIUM AND MODULATED SIGNAL

BACKGROUND OF THE INVENTION

1. Field of the Invention

The present invention relates to coding information, and more particularly, to a method and apparatus for coding information having improved information density. The present invention further relates to producing a modulated signal from the coded information, producing a recording medium from the coded information, and the recording medium itself. The present invention still further relates to a method and apparatus for decoding coded information, and decoding coded information from a modulated signal and/or a recording medium.

2. Description of the Background Art

When data is transmitted through a transmission line or recorded onto a recording medium such as a magnetic disc, an optical disc or a magneto-optical disc, the data is modulated into code matching the transmission line or the recording medium prior to the transmission or recording.

Run length limited codes, generically designated as (d, k) codes, have been widely and successfully applied in modern magnetic and optical recording systems. Such codes, and means for implementing such codes are described by K. A. Schouhamer Immink in the book entitled "Codes for Mass Data Storage Systems" (ISBN 90-74249-23-X, 1999). Run length limited codes are extensions of earlier non return to zero recording codes, where binary recorded "zeros" are represented by no (magnetic flux) change in the recording medium, while binary "ones" are represented by transitions from one direction of recorded flux to the opposite direction.

In a (d, k) code, the above recording rules are maintained with the additional constraints that at least d "zeros" are recorded between consecutive "ones", and no more than k "zeros" are recorded between consecutive "ones". The first constraint arises to obviate intersymbol interference occurring because of pulse crowding of the reproduced transitions when a series of "ones" are contiguously recorded. The second constraint arises to ensure recovering a clock from the reproduced data by "locking" a phase locked loop to the reproduced transitions. If there is too long an unbroken string of contiguous "zeros" with no interspersed "ones", the clock regenerating phase-locked-loop will fall out of synchronism. In, for example, a (2,7) code there is at least two "zeros" between recorded "ones", and there are no more than seven recorded contiguous "zeros" between recorded "ones".

The series of encoded bits is converted, via a modulo-2 integration operation, to a corresponding modulated signal formed by bit cells having a high or low signal value. A "one" bit is represented in the modulated signal by a change from a high to a low signal value or vice versa, and a "zero" bit is represented by the lack of change in the modulated signal.

The information conveying efficiency of such codes is typically expressed as a rate, which is the quotient of the number of bits (m) in the information word to the number of bits (n) in the code word (i.e., m/n). The theoretical maximum rate of a code, given values of d and k, is called the Shannon capacity. FIG. 1 tabulates the Shannon capacity C(d,k) for d=2 versus k. As shown, for a (2,7) code, the Shannon capacity, C(2,7), has a value of 0.5174. This means that a (2,7) code cannot have a rate larger than 0.5174. The practical implementation of codes requires that the rate be a rational fraction, and to date the above (2,7) code has a rate ½. This rate of ½ is slightly less than the Shannon capacity of 0.5174, and the code is therefore a highly efficient one. To achieve the ½ rate, 1 unconstrained data bit is mapped into 2 constrained encoded bits.

(2,7) codes having a rate of ½ and means for implementing associated encoders and decoders are known in the art. U.S. Pat. No. 4,115,768 entitled "Sequential Encoding and Decoding of Variable Word Length, Fixed Rate Data Codes", issued in the names of Eggenberger and Hodges, discloses an encoder whose output sequences satisfy the imposed runlength constraints.

However, a demand exists for even more efficient codes so that, for example, the information density on a recording medium or over a transmission line can be increased.

SUMMARY OF THE INVENTION

In the converting method and apparatus according to the present invention, m-bit information words are converted into n-bit code words at a rate greater than ½. Consequently, the same amount of information can be recorded in less space, and information density increased.

In the present invention, n-bit code words are divided into a first type, a second type and a third type, and into coding states of a first kind, a second kind and a third kind such that an m-bit information word is converted into an n-bit code word of the first, second or third kind if the previous m-bit information word was converted into an n-bit code word of the first type and is converted into an n-bit code word of the first or third kind, if the previous m-bit information word was converted into an n-bit code word of the second type and is converted into an n-bit code word of the first kind, if the previous m-bit information word was converted into an n-bit code word of the third type. Further, sets of code words belonging to the different coding states do not contain any code words in common. In one embodiment, n-bit code words of the first type end in "00", n-bit code words of the second type end in "10", n-bit code words of the third type end in "01", n-bit code words belonging to the states of the first kind start with "00", n-bit code words belonging to the states of the second kind start with "00", "01" or "10", and n-bit code words belonging to the states of the third kind start with "00" or "01". Furthermore, in the embodiments according to the present invention, the n-bit code words satisfy a dk-constraint to (2,k) such that a minimum of 2 zeros and a maximum of k zeros falls between consecutive ones.

In other embodiments of the present invention, the coding device and method according to the present invention are employed to record information on a recording medium and create a recording medium according to the present invention.

In still other embodiments of the present invention, the coding device and method according to the present invention are further employed to transmit information.

In the decoding method and apparatus according to the present invention, n-bit code words created according to the coding method and apparatus are decoded into m-bit information words. The decoding involves determining the state of a next n-bit code word, and based on the state determination, the current n-bit code word is converted into an m-bit information word.

In other embodiments of the present invention, the decoding device and method according to the present invention are employed to reproduce information from a recording medium.

In still other embodiments of the present invention, the decoding device and method according to the present invention are employed to receive information transmitted over a medium.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein:

FIG. 1 tabulates the Shannon capacity C(d,k) for d=2 versus k;

FIG. 2 shows an example of how the code words in the various subgroups are allocated into the various states in the first embodiment;

FIGS. 4A–4B show a complete translation table according to the first embodiment for converting 6-bit information words into 11-bit code words;

FIGS. 13A–13B show the beginning portion of a translation table according to the second embodiment for converting 11-bit information words into 20-bit code words;

FIG. 14 shows an example of how the code words in the various subgroups are allocated into the various states in the third embodiment;

FIGS. 15A–15B show a translation table according to the third embodiment for converting 6-bit information words into 11-bit code words;

FIG. 16 shows an example of how the code words in the various subgroups are allocated into the various states in the fourth embodiment;

Figure 17A:
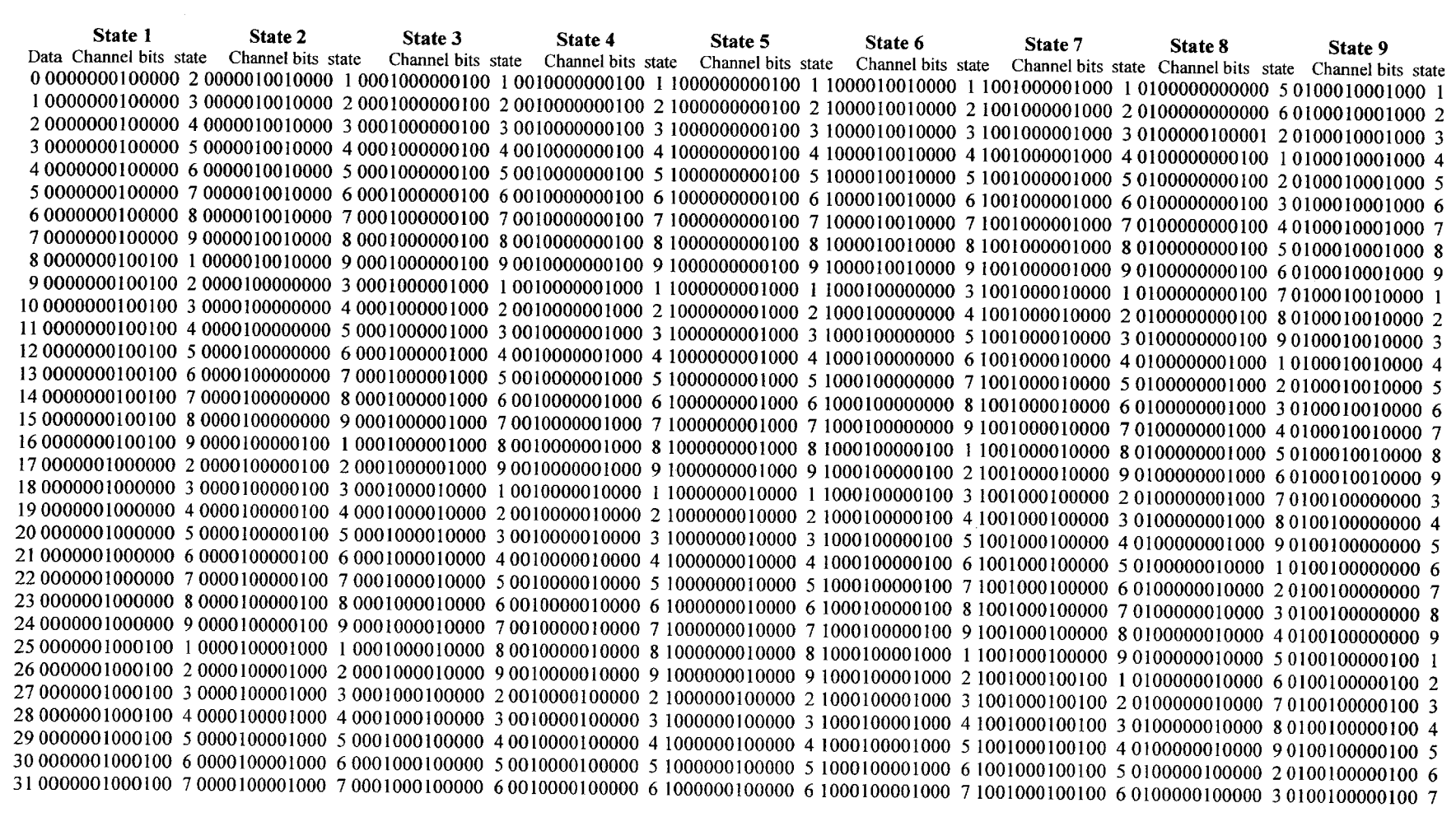

FIGS. 17A–17D show a translation table according to the fourth embodiment for converting 7-bit information words into 13-bit code words.

DETAILED DESCRIPTION OF THE PREFERRED EMBODIMENTS

Figure 3:
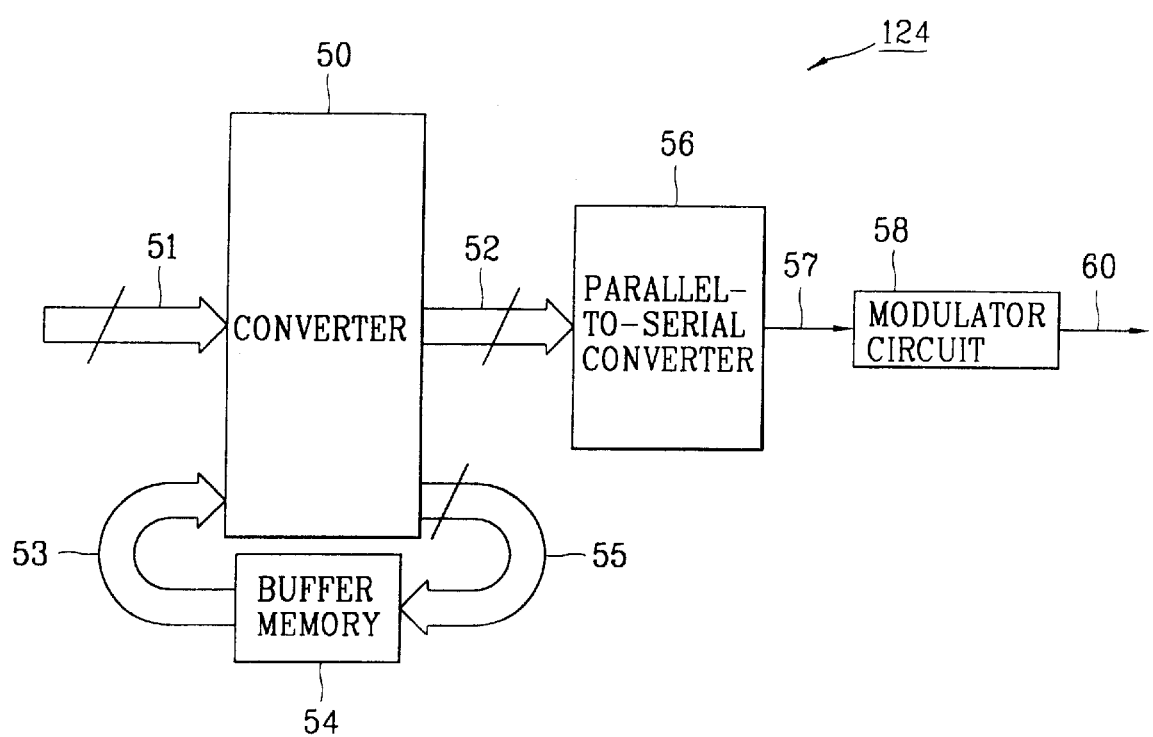
FIG. 3 shows an embodiment for a coding device according to the invention.

The general coding method according to the present invention will be described followed by a specific first embodiment of the coding method. Next, the general decoding method according to the present invention will be described in the context of the first embodiment. The various apparatuses according to the present invention will then be described. Specifically, the coding device, recording device, transmission device, decoding device, reproducing device and receiving device according to the present invention will be described. Afterwards, additional coding embodiments according to the present invention will be described.

CODING METHOD

According to the present invention, an m-bit information word is converted into an n-bit code word such that the rate of m/n is greater than ½. The code words are divided into first, second and third types wherein the first type includes code words ending with "00", the second type includes code words ending with "10" and the third type includes code words ending with "01". As a result, the code words of the first type are divided into three subgroups E0000, E1000 and E0100, code words of the second type are divided into three subgroups E0010, E1010 and E0110, and the code words of the third type are divided into three subgroups E0001, E1001 and E0101. Code word subgroup E0000 includes code words that start with "00" and end with "00", code word subgroup E1000 includes code words that start with "10" and end with "00", code word subgroup E0100 includes code words that start with "01" and end with "00". Code word subgroup E0010 includes code words that start with "00" and end with "10", code word subgroup E1010 includes code words that start with "10" and end with "10", code word subgroup E0110 includes code words that start with "01" and end with "10". Code word subgroup E0001 includes code words that start with "00" and end with "01", code word subgroup E1001 includes code words that start with "10" and end with "01", code word subgroup E0101 includes code words that start with "01" and end with "01".

The code words are also divided into at least one state of a first kind, at least one state of a second kind, and at least one state of a third kind. States of the first kind include code words that only start with "00" and states of the second kind include code words that start with one of the "00", "01" and "10", and states of the third kind include code words that start with either "00" or "01".

Further, sets of code words belonging to the different coding states do not contain any code words in common. In other words, different states can not include the same code word.

CODING METHOD ACCORDING TO A FIRST EMBODIMENT

In a first preferred embodiment of the present invention, 6-bit information words are converted into 11-bit code words. The code words satisfy a (2,k) constraint, an d are divided into 4(r1) states of the first kind, 3(r2) states of the second kind, and 2(r3) states of the third kind (total of r=r1+r2+r3=9 states). In order to reduce the k-constraint, a code word, namely, "0000000000000" is barred from the encoding tables.

To perform encoding, each 11-bit code word in each state is associated with a coding state direction. The state direction indicates the next state from which to select a code word in the encoding process. The state directions are assigned to code words such that code words that end with a "00" (i.e. code words in subgroups E0000, E1000 and E0100) have associated state directions that indicate any of the r=9 states, while code words that end with a "10" (i.e., code words in subgroups E0010, E1010 and E0110) have associated state directions that only indicate one of the states of the first kind or the third kind. Furthermore, code words that end with a "01" (i.e., code words in subgroups E0001, E1001 and E0101) have associated state directions that only indicate one of the states of the first kind. This ensures that the d=2 constraint will be satisfied.

Furthermore, while, as explained in more detail below, the same code word can be assigned to different information words in the same state, different states cannot include the same code word. In particular code words in subgroups E0000, E1000 and E0100 can be assigned 9 times to different information words within one state, while code words in subgroups E0010, E1010 and E0110 can be assigned 6 times to different information words within one state. Furthermore, code words in subgroups E0001, E1001 and E0101 can be assigned 4 times to different information words within one state. As there are 18 code words in subgroup E0000, 13 code words in subgroup E1000 and 9 code words in subgroup E0100, there are 360 (9*(18+13+9)) "code word—state direction" combinations for code words of the first type. There are 9 code words in subgroup E0010, 6 code words in subgroup E1010 and 4 code words in subgroup E0110, so that there are 114 (6*(9+6+4)) "code word—state direction" combinations for code words of the second type. There are 11 code words in subgroup E0001, 9 code words in subgroup E1001 and 6 code words in subgroup E0101, so that there are 104 (4*(11+9+6)) "code word—state direction" combinations for code words of the third type. In total 360+114+104=578 "code word—state direction" combinations exist.

For m-bit information words, there are a total of $2^m$ possible information words. So, for 6-bit information words, $2^6$=64 information words exist. Because there are nine states in this encoding embodiment, 9 times 64=576 of the "code word—state direction" combinations are needed. This leaves 578−576=2 remaining combinations.

The available code words in the various subgroups are distributed over the states of the first, the second and third kind in compliance with the restrictions discussed above. FIG. 2 shows an example of how the code words in the various subgroups are allocated in this embodiment to the various states. As shown in FIG. 2, in this example, states 1, 2, 3 and 4 are states of the first kind, and states 5, 6 and 7 are states of the second kind, and states 8 and 9 are states of the third kind. Taking the subgroup E0000 of size 18 as an example, subgroup E0000 has 6 code words in states 1 and 4 code word in each of states 2, 3 and 4. And, taking state 1 as an example, in state 1 the number of "code word—state direction" combinations is 9×6+6×1+4×1=64, which means that 6-bit information words can be assigned. Remember, each code word of the first type can be assigned any one of the nine different states as a state directions, and therefore used nine times within a state; while each code word of the second type can only be assigned one of the six states of the first kind and the third kind as a state direction because of the d=2 restriction, and therefore used six times within a state. Furthermore, each code word of the third type can only be assigned one of the four states of the first kind as a state direction because of the d=2 restriction, and therefore used four times within a state.

It can be verified that from any of the r=9 coding states shown in FIG. 2 there at least 64 information words that can be assigned to code words, which is enough to accommodate 6-bit information words. In the manner described above any random series of 6-bit information words can be uniquely converted to a series of code words.

FIGS. 4A–4B show a complete translation table according to this embodiment for converting 6-bit information words into 11-bit code words. Included in the translation table of FIGS. 4A–4B are the state direction assigned to each code word. Specifically, in FIGS. 4A–4B, the first column shows the decimal notation of the information words. The second, fourth, sixth, eighth, tenth, twelfth, fourteenth, sixteenth, and eighteenth columns show the code words (also referred to in the art as channel bits) assigned to the information words in states 1, 2, 3, 4, 5, 6, 7, 8 and 9, respectively. The third, fifth, seventh, ninth, eleventh, thirteenth, fifteenth, seventeenth and nineteenth columns show by way of the respective digits 1, 2, 3, 4, 5, 6, 7, 8 and 9, the state direction of the associated code words in the second, fourth, sixth, eighth, tenth, twelfth, fourteenth, sixteenth, and eighteenth columns, respectively.

Figures 5, 6:
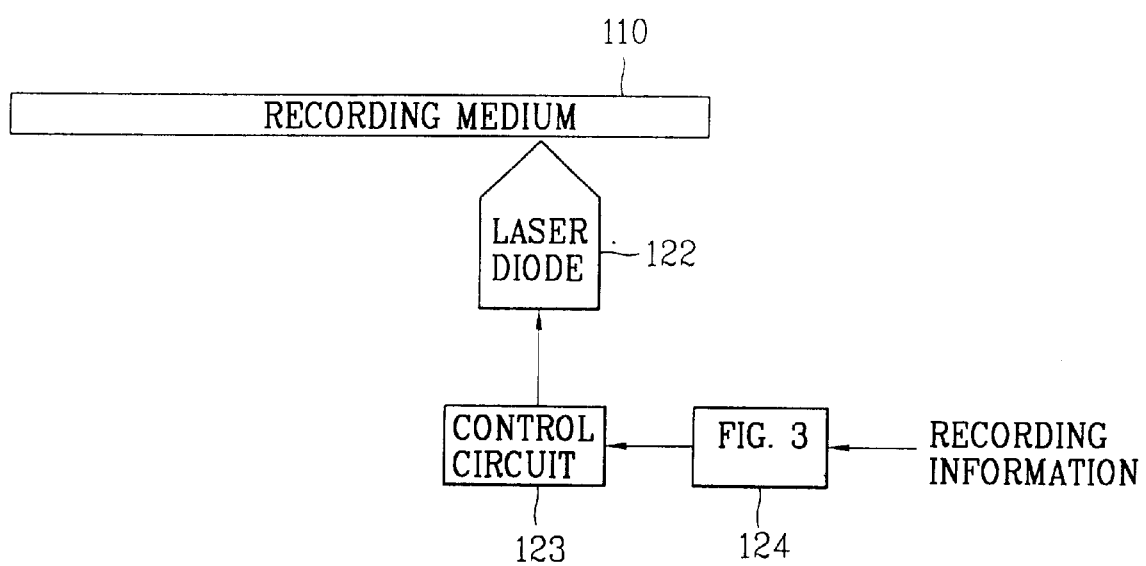
FIG. 5 illustrates the conversion of a series of information words into a series of code words using the translation table of FIGS. 4A–4B.
FIG. 6 illustrates an embodiment of a recording device according to the present invention.

The conversion of a series of information words into a series of code words will be further explained with reference to FIG. 5. The first column of FIG. 5 shows from top to bottom a series of successive 6-bit information words, and the second column shows in parenthesis the decimal values of these information words. The third column "state" is the coding state that is to be used for the conversion of the information word. The "state" is laid down when the preceding code word was delivered (i.e., the state direction of the preceding code word). The fourth column "code words" includes the code words assigned to the information words according to the translation table of FIGS. 4A–B. The fifth column "next state" is the state direction associated with the code word in the fourth column and is also determined according to the translation table of FIGS. 4A–B.

The first word from the series of information words shown in the first column of FIG. 5 has a word value of "1" in decimal notation. Let us assume that the coding state is state 1 (S1) when the conversion of the series of information words is initiated. Therefore the first word is translated into code word "00000000100" according to the state 1 set of code words from the translation table. At the same time the next state becomes state 2 (S2) because the state direction assigned to code word "00000000100" representing decimal value 1 in state 1 is state 2. This means that the next information word (decimal value "3") is going to be translated using the code words in state 2. Consequently, the next information word, having a decimal value of "3", is translated into code word "00001000100". Similar to the manner described above, the information words having the decimal values "5", "12" and "19" are converted.

Decoding Method

Hereinafter, decoding of n-bit code words (in this example 11-bit words) received from a recording medium will be further explained with reference to FIGS. 4A–4B. For the purposes of description, assume that the word values of a series of successive code words received from, for example, a recording medium are "00000001000", "00010010000", "10000100100". From the translation table of FIGS. 4A–4B, it is found that the first code word "00000001000" is assigned to the information words "9", "10", "11", "12", "13", "14", "15", "16", and "17" and state directions 1, 2, 3, 4, 5, 6, 7, 8 and 9, respectively. The next code word value is "00010010000", and belongs to the set of code words in state 3. This means that the first code word "00000001000" had a state direction of 3. The first code word "00000001000" with a state direction of 3 represents the information word having a decimal value of "11". Therefore, it is determined that the first code word represents information word "00000001000" having a decimal value of "11".

Furthermore, the third code word "10000100100" is a member of state 6. Therefore, it is determined in the same manner as above that the second code word "00010010000" represents the information word having the decimal value "14". In the same manner other code words can be decoded. It is noted that both the current code word and the next code words are observed to decode the current code word into a unique information word.

Coding Device

FIG. 3 shows an embodiment for a coding device 124 according to the invention. The coding device 124 converts m-bit information words into n-bit code words, where the number of different coding states r is represented by s bits. For example, when the number of coding states r=9, s equals 4. As shown, the coding device 124 includes a converter 50 for converting (m+s) binary input signals to (n+s) binary output signals. In a preferred embodiment, the converter 50 includes a read only memory (ROM) storing a translation table according to at least one embodiment of the present invention and address circuitry for addressing the translation table based on the m+s binary input signals. However, instead of a ROM, the converter 50 can include a combinatorial logic circuit producing the same results as the translation table according to at least one embodiment of the present invention.

From the inputs of the converter 50, m inputs are connected to a first bus 51 for receiving m-bit information words. From the outputs of the converter 50, n outputs are connected to a second bus 52 for delivering n-bit code words. Furthermore, s inputs are connected to an s-bit third bus 53 for receiving a state word that indicates the instantaneous coding state. The state word is delivered by a buffer memory 54 including, for example, s flip-flops. The buffer memory 54 has s inputs connected to a fourth bus 55 for receiving a state direction to be loaded into the buffer memory 54 as the state word. For delivering the state directions to be loaded in the buffer memory 54, the s outputs of the converter 50 are used.

The second bus 52 is connected to the parallel inputs of a parallel-to-serial converter 56, which converts the code words received over the second bus 52 to a serial bit string. A signal line 57 supplies the serial bit string to a modulator circuit 58, which converts the bit string into a modulated signal. The modulated signal is then delivered over a line 60. The modulator circuit 58 is any well-known circuit for converting binary data into a modulated signal such as a modula-2 integrator.

For the purposes of synchronizing the operation of the coding device, the coding device includes a clock generating circuit (not shown) of a customary type for generating clock signals for controlling timing of, for example, the parallel/serial converter 58 and the loading of the buffer memory 54.

In operation, the converter 50 receives m-bit information words and an s-bit state word from the first bus 51 and the third bus 53, respectively. The s-bit state word indicates the state in the translation table to use in converting the m-bit information word. Accordingly, based on the value of the m-bit information word, the n-bit code word is determined from the code words in the state identified by the s-bit state word. Also, the state direction associated with the n-bit code word is determined. The state direction, namely, the value thereof is converted into an s-bit binary word; or alternatively, the state directions are stored in the translation table as s-bit binary words. The converter 50 outputs the n-bit code word on the second bus 52, and outputs the s-bit state direction on fourth bus 55. The buffer memory 54 stores the s-bit state direction as a state word, and supplies the s-bit state word to the converter 50 over the third bus 53 in synchronization with the receipt of the next m-bit information word by the converter 50. This synchronization is produced based on the clock signals discussed above in any well-known manner.

The n-bit code words on the second bus 52 are converted to serial data by the parallel/serial converter 56, and then the serial data is converted into a modulated signal by the modulator 58.

The modulated signal may then undergo further processing for recordation or transmission.

Recording Device

FIG. 6 shows a recording device for recording information that includes the coding device 124 according to the present invention as shown in FIG. 3. As shown in FIG. 6, m-bit information is converted into a modulated signal through the coding device 124. The modulated signal produced by the coding device 124 is delivered to a control circuit 123. The control circuit 123 may be any conventional control circuit for controlling an optical pick-up or laser diode 122 in response to the modulated signal applied to the control circuit 123 so that a pattern of marks corresponding to the modulated signal are recorded on the recording medium 110.

Figure 7:
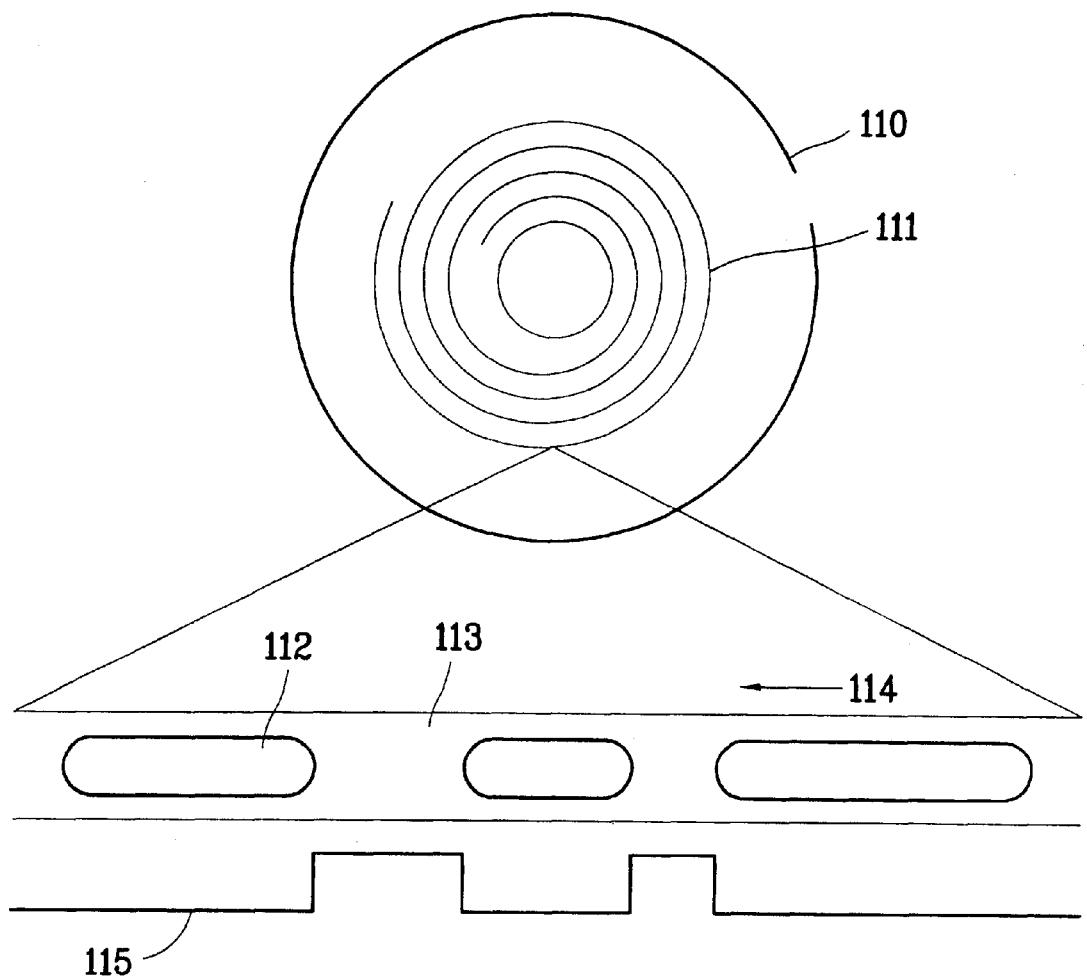
FIG. 7 illustrates a recording medium and modulated signal according to the present invention.

FIG. 7 shows by way of example, a recording medium 110 according to the invention. The recording medium 110 shown is a read-only memory (ROM) type optical disc. However, the recording medium 110 of the present invention is not limited to a ROM type optical disk, but could be any type of optical disk such as a write-once read-many (WORM) optical disk, random accessible memory (RAM) optical disk, etc. Further, the recording medium 110 is not limited to being an optical disk, but could be any type of recording medium such as a magnetic disk, a magneto-optical disk, a memory card, magnetic tape, etc.

As shown in FIG. 7, the recording medium 110 according to one embodiment of the present invention includes information patterns arranged in tracks 111. Specifically, FIG. 7 shows an enlarged view of a track 111 along a direction 114 of the track 111. As shown, the track 111 includes pit regions 112 and non-pit regions 113. Generally, the pit and non-pit regions 112 and 113 represent constant signal regions of the modulated signal 115 (zeros in the code words) and the transitions between pit and non-pit regions represent logic state transitions in the modulated signal 115 (ones in the code words).

As discussed above, the recording medium 110 may be obtained by first generating the modulated signal and then recording the modulated signal on the recording medium 110. Alternatively, if the recording medium is an optical disc, the recording medium 110 can also be obtained with well-known mastering and replica techniques.

Transmission Device

Figure 8:
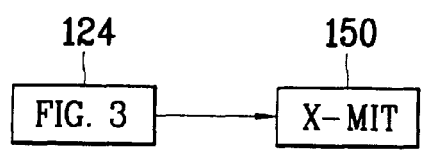
FIG. 8 illustrates a transmission device according to the present invention.

FIG. 8 shows a transmission device for transmitting information that includes the coding device 124 according to the present invention as shown in FIG. 3. As shown in FIG. 8, m-bit information words are converted into a modulated signal through the coding device 124. A transmitter 150 then further processes the modulated signal, to convert the modulated signal into a form for transmission depending on the communication system to which the transmitter belongs, and transmits the converted modulated signal over a transmission medium such as air (or space), optical fiber, cable, a conductor, etc.

Decoding Device

Figure 9:
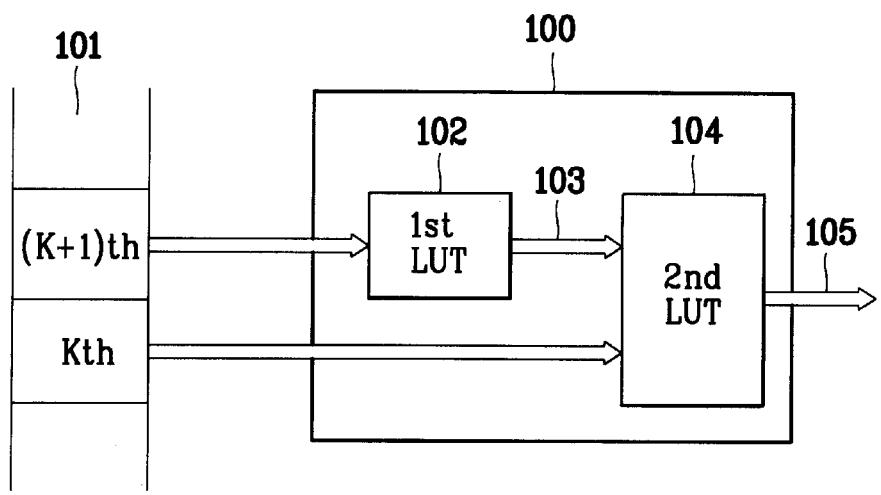
FIG. 9 illustrates a decoding device according to the present to invention.

FIG. 9 illustrates a decoder according to the present invention. The decoder performs the reverse process of the converter of FIG. 3 and converts n-bit code words of the present invention into m-bit information words. As shown, the decoder 100 includes a first look-up table (LUT) 102 and a second LUT 104. The first and second LUTs 102 and 104 store the translation table used to create the n-bit code words being decoded. Where K refers to time, the first LUT 102 receives the (K+1)th n-bit code word and the second LUT 104 receives the output of the first LUT 102 and the Kth n-bit code word. Accordingly, the decoder 100 operates as a sliding block decoder. At every block time instant the decoder 100 decodes one n-bit code word into one m-bit information word and proceeds with the next n-bit code word in the serial data (also referred to as the channel bit stream).

In operation, the first LUT 102 determines the state of the (K+1)th code word from the stored translation table, and outputs the state to the second LUT 104. So the output of the first LUT 102 is a binary number in the range of 1, 2, ..., r (where r denotes the number of states in the translation table). The second LUT 104 determines the possible m-bit information words associated with Kth code word from the Kth code word using the stored translation table, and then determines the specific one of the possible m-bit information words being represented by the n-bit code word using the state information from the first LUT 102 and the stored translation table.

For the purposes of further explanation only, assume the n-bit code words are 11-bit code words produced using the translation table of FIGS. 4A–4B. Then, referring to FIG. 5, if the (K+1)th 11-bit code word is "00001000100" the first LUT 102 determines the state as state 2. Furthermore, if the Kth 11-bit code word is "00000000100", then the second LUT 104 determines that the Kth 11-bit code word represents one of the 6-bit information words having a decimal value of 0, 1, 2, 3, 4, 5, 6, 7, 8 or 9. And, because the next state or state direction of state 2 is supplied by the first LUT 102, the second LUT 104 determines that the Kth 11-bit code word represents the 6-bit information word having a decimal value of 1 because the 11-bit code word "00000000100" associated with a state direction of 2 represents the 6-bit information word having a decimal value of 1.

Reproducing Device

Figure 10:
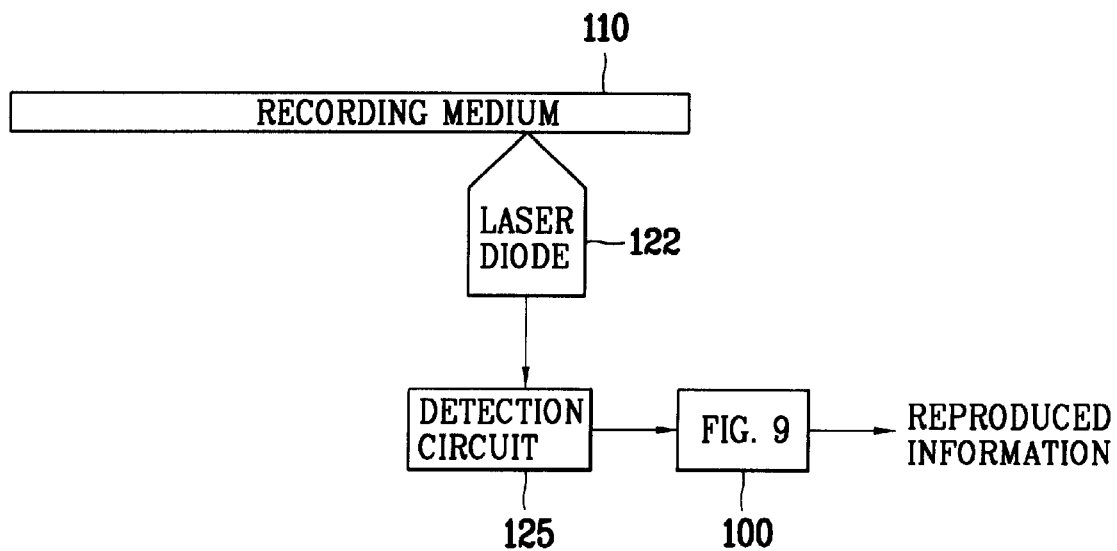
FIG. 10 illustrates a reproducing device according to the present invention.

FIG. 10 illustrates a reproducing device that includes the decoder 100 according to the present invention as shown in FIG. 9. As shown, the reading device includes an optical pick-up 122 of a conventional type for reading a recording medium 110 according to the invention. The recording medium 110 may be any type of recording medium such as discussed previously. The optical pickup 122 produces an analog read signal modulated according to the information pattern on the recording medium 110. A detection circuit 125 converts this read signal in conventional fashion into a binary signal of the form acceptable to the decoder 100. The decoder 100 decodes the binary signal to obtain the m-bit information words.

Receiving Device

Figures 11, 12:
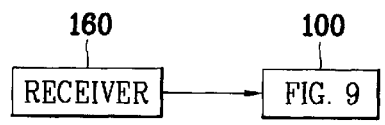
FIG. 11 illustrates a receiving device according to the present invention.
FIG. 12 shows an example of how the code words in the various subgroups are allocated in to the various states in the second embodiment.

FIG. 11 illustrates a receiving device that includes the decoder 100 according to the present invention as shown in FIG. 9. As shown, the receiving device includes a receiver 160 for receiving a signal transmitted over a medium such as air (or space), optical fiber, cable, a conductor, etc. The receiver 160 converts the received signal into a binary signal of the form acceptable to the decoder 100. The decoder 100 decodes the binary signal to obtain the m-bit information words.

Coding Method According to a Second Embodiment

FIGS. 12 and 13A–13B illustrate another embodiment of the present invention. According to this embodiment, the greater than ½ rate is achieved by converting 11-bit information words into 20-bit code words; wherein the number of coding states r equals 9, and 4 of the coding states are coding states of the first kind and 3 of the coding states are coding states of the second kind and 2 of the coding states are coding state of the third kind. Also, the code words satisfy a (2,k) constraint. FIG. 12 corresponds to FIG. 2 of the first embodiment, and illustrates the division of code words among the states in this second embodiment.

As described above, code words that end with a "00", i.e. code words in subgroups E0000, E1000, and E0100, are allowed to enter any of the r=9 states, while code words that end with a "10" i.e. code words in subgroups E0010, E1010 and E0110, may only enter the states of the first kind or third kind (State 1 to State 4 or State 8 to State 9). Furthermore, code words that end with a "01" i.e. code words in subgroups E0001, E1001 and E0101, may only enter the states of the first kind (State 1 to State 4).

Therefore, code words in subgroups E0000, E1000 and E0100 can be assigned 9 times to different information words, while code words in subgroups E0010, E1010 and E0110 can be assigned 6 times to different information words, and code words in subgroups E0001, E1001 and E0101 can be assigned 4 times to different information words. Referring to FIG. 12, subgroup E0000 has 152 code words in state 1, and the subgroup E0010 has 65 code words in state 1, and the subgroups E0001 has 70 code words in state 1. So the number of "code words—state direction" combinations is (9×152)+(6×65)+(4×75)=2,058, which means that 11-bit information words ($2^{11}$=2,048) can be assigned. It can be verified that from any of the r=9 coding states there at least 2,048 information words that can be assigned to code words, which is enough to accommodate 11-bit information words.

FIGS. 13A–13B illustrate the beginning portion of the translation table for this second embodiment in the same fashion that FIGS. 4A–4B illustrated the translation table for the first embodiment.

Coding Method According to a Third Embodiment

FIGS. 14 and 15A–15B illustrate another embodiment of the present invention. According to this embodiment, the greater than ½ rate is achieved by converting 6-bit information words into 11-bit code words; wherein the number of coding states r equals 9, and 4 of the coding states are coding states of the first kind and 3 of the coding states are coding states of the second kind and 2 of the coding states are coding state of the third kind, similar to those of the first embodiment. Also, the code words satisfy a (2,k) constraint. FIG. 14 corresponds to FIG. 2 of the first embodiment, and illustrates the division of code words among the states in this third embodiment. It can be verified that from any of the r=9 coding states there at least 64 information words that can be assigned to code words, which is enough to accommodate 6-bit information words.

FIGS. 15A–15B illustrate a translation table for this third embodiment in the same fashion that FIGS. 4A–4B illustrated the translation table for the first embodiment.

Coding Method According to a Fourth Embodiment

FIGS. 16 and 17A–17D illustrate another embodiment of the present invention. According to this embodiment, the greater than ½ rate is achieved by converting 7-bit information words into 13-bit code words; wherein the number of coding states r equals 9, and 4 of the coding states are coding states of the first kind and 3 of the coding states are coding states of the second kind and 2 of the coding states are coding state of the third kind, similar to those of the first embodiment. Also, the code words satisfy a (2,k) constraint. FIG. 16 corresponds to FIG. 2 of the first embodiment, and illustrates the division of code words among the states in this fourth embodiment. It can be verified that from any of the r=9 coding states there at least 128 information words that can be assigned to code words, which is enough to accommodate 7-bit information words.

FIGS. 17A–17D illustrate a translation table for this fourth embodiment in the same fashion that FIGS. 4A–4B illustrated the translation table for the first embodiment.

The invention has been described in detail with particular reference to preferred embodiments thereof, but it will be understood that variations and modifications can be effected within the spirit and scope of the invention.

What is claimed is:

1. A method of converting, comprising:
   receiving m-bit information words, where m is an integer;
   converting the m-bit information words into n-bit code words, where n is an integer greater than m, the n-bit code words being divided into a first type, a second type and a third type, and into coding states of a first kind, a second kind and a third kind such that an m-bit information word is converted into an n-bit code word of the first, second or third kind if the previous m-bit information word was converted into an n-bit code word of the first type and is converted into an n-bit code word of the first or third kind, if the previous m-bit information word was converted into an n-bit code word of the second type and is converted into an n-bit code word of the first kind, if the previous m-bit information word was converted into an n-bit code word of the third type, wherein sets of code words belonging to the different coding states do not contain any code words in common.

2. The method of claim 1, wherein the converting step converts the m-bit information words into n-bit code words that satisfy a dk-constraint, where d indicates a minimum number of zeros between consecutive ones in the n-bit code words and k indicates a maximum number of zeros between consecutive ones in the n-bit code words.

3. The method of claim 2, wherein m/n is greater than ½, and d=2.

4. The method of claim 2, wherein d=2.

5. The method of claim 2, wherein the n-bit code words are divided into r1 coding states of the first kind, r2 coding states of the second kind and r3 coding states of the third kind, where r1, r2, and r3 are integers greater than or equal to 1, and each of the r1, r2 and r3 coding states have n-bit code words different from the n-bit code words in the other r1, r2 and r3 coding states.

6. The method of claim 5, wherein m/n is greater than ½, d=2, r1=4, r2=3 and r3=2.

7. The method of claim 5, wherein r1=4, r2=3 and r3=2.

8. The method of claim 5, wherein r1+r2+r3 equals 9.

9. The method of claim 1, wherein the n-bit code words of the first type end in "00", the n-bit code words of the second type end in "10" and the n-bit code words of the third type end in "01".

10. The method of claim 9, wherein the n-bit code words in a coding state of the first kind start with "00", the n-bit code words in a coding state of the second kind start with "00", "01" or "10", and the n-bit code words in a coding state of the third kind start with "00" or "01".

11. The method of claim 1, wherein the converting step converts at a coding rate of m/n, which is greater than ½.

12. The method of claim 1, wherein m is equal to 6 and n is equal to 11.

13. The method of claim 1, further comprising:
   generating a modulated signal from the n-bit code words.

14. The method of claim 13, further comprising:
   recording the modulated signal in a recording medium.

15. The method of claim 13, further comprising:
   transmitting the modulated signal.

16. The method of claim 1, wherein the converting step converts the m-bit information words into the n-bit code words using a translation table.

17. The method of claim 1, wherein m is equal to 11 and n is equal to 20.

18. The method of claim 1, wherein m is equal to 7 and n is equal to 13.

19. A method of converting, comprising:
   receiving m-bit information words, where m is an integer;
   converting the m-bit information words into n-bit code words that satisfy a dk-constraint, where n is an integer greater than m, d indicates a minimum number of zeros between consecutive ones in the n-bit code words and k indicates a maximum number of zeros between consecutive ones in the n-bit code words, the n-bit code words being divided into a first type, a second type and a third type and into coding states of a first kind, a second kind and a third kind an m-bit information word is converted into an n-bit code word of the first, second or third kind if the previous m-bit information word was converted into an n-bit code word of the first type and is converted into an n-bit code word of the first or third kind, if the previous m-bit information word was converted into an n-bit code word of the second type and is converted into an n-bit code word of the first kind, if the previous m-bit information word was converted into an n-bit code word of the third type, wherein the n-bit code words of the first type end in "00", the n-bit code words of the second type end in "10" and the n-bit code words of the third type end in "01", and n-bit code words in a coding state of the first kind start with "00", the n-bit code words in a coding state of the second kind start with "00" "01", or "10", and the n-bit code words in a coding state of the third kind start with "00" or "01", wherein sets of code words belonging to the different coding states do not contain any code words in common.

20. A coding device, comprising:
   a converter receiving m-bit information words, where m is an integer and converting the m-bit information words into n-bit code words, where n is an integer greater than m, the n-bit code words being divided into a first type, a second type and a third type, and into coding states of a first kind, a second kind and a third kind such that an m-bit information word is converted into an n-bit code word of the first, second or third kind if the previous m-bit information word was converted into an n-bit code word of the first type and is converted into an n-bit code word of the first or third kind, if the previous m-bit information word was converted into an n-bit code word of the second type and is converted into an n-bit code word of the first kind, if the previous m-bit information word was converted into an n-bit code word of the third type, wherein sets of code words belonging to the different coding states do not contain any code words in common.

21. The coding device of claim 20, wherein the converter receives a coding state with each m-bit information word and converts the m-bit information word into the n-bit code word based on the coding state.

22. The coding device of claim 21, further comprising:
a buffer supplying the coding state to the converter; and wherein
the converter determines the coding state for the next m-bit information word as part of the converting process, and stores the determined coding state in the buffer.

23. The coding device of claim 22, wherein the converter converts the m-bit information word into the n-bit code word and determines the coding state using a translation table.

24. The coding device of claim 20, further comprising:
a modulator generating a modulated signal from the n-bit code words.

25. The coding device of claim 24, further comprising:
a recording device recording the modulated signal in a recording medium.

26. The coding device of claim 24, further comprising:
a transmitter transmitting the modulated signal.

27. A method of manufacturing a recording medium, comprising:
converting m-bit information words into n-bit code words, where n is an integer greater than m, the n-bit code words being divided into a first type, a second type and a third type and into coding states of a first kind, a second kind and a third kind such that an m-bit information word is converted into an n-bit code word of the first, second or third kind if the previous m-bit information word was converted into an n-bit code word of the first type and is converted into an n-bit code word of the first or third kind, if the previous m-bit information word was converted into an n-bit code word of the second type and is converted into an n-bit code word of the first kind, if the previous m-bit information word was converted into an n-bit code word of the third type, wherein sets of code words belonging to the different coding states do not contain any code words in common;
generating a modulated signal from the n-bit code words; and
recording the modulated signal in a recording medium.

28. A recording medium having a modulated signal recorded in a track, the modulated signal including signal portions representing n-bit code words, where n is an integer, each n-bit code word representing an m-bit information word, where m is an integer less than n, the n-bit code words being divided into a first type, a second type and a third type and into coding states of a first kind, a second kind and a third kind such that an m-bit information word is converted into an n-bit code word of the first, second or third kind if the previous m-bit information word was converted into an n-bit code word of the first type and is converted into an n-bit code word of the first or third kind, if the previous m-bit information word was converted into an n-bit code word of the second type and is converted into an n-bit code word of the first kind, if the previous m-bit information word was converted into an n-bit code word of the third type, wherein sets of code words belonging to the different coding states do not contain any code words in common.

29. The recording medium of claim 28, wherein the signal portions represent the n-bit code words such that each successive n-bit code word partially instructs a reproducing device on which of at least two m-bit information words are represented by each previous n-bit code word.

30. A modulated signal, comprising:
signal portions representing n-bit code words, where n is an integer, each n-bit code word representing an m-bit information word, where m is an integer less than n, the n-bit code words being divided into a first type, a second type and a third type and into coding states of a first kind, a second kind and a third kind such that an m-bit information word is converted into an n-bit code word of the first, second or third kind if the previous m-bit information word was converted into an n-bit code word of the first type and is converted into an n-bit code word of the first or third kind, if the previous m-bit information word was converted into an n-bit code word of the second type and is converted into an n-bit code word of the first kind, if the previous m-bit information word was converted into an n-bit code word of the third type, wherein sets of code words belonging to the different coding states do not contain any code words in common.

31. The modulated signal of claim 30, wherein the signal portions represent the n-bit code words such that each successive n-bit code word partially instructs a reproducing device on which of at least two m-bit information words are represented by each previous n-bit code word.

32. A method of decoding, comprising:
receiving n-bit code words, where n is an integer;
converting the n-bit code words into m-bit information words, where m is an integer less than n, the n-bit code words being divided into a first type, a second type and a third type and into coding states of a first kind, a second kind and a third kind such that an m-bit information word is converted into an n-bit code word of the first, second or third kind if the previous m-bit information word was converted into an n-bit code word of the first type and is converted into an n-bit code word of the first or third kind, if the previous m-bit information word was converted into an n-bit code word of the second type and is converted into an n-bit code word of the first kind, if the previous m-bit information word was converted into an n-bit code word of the third type, wherein sets of code words belonging to the different coding states do not contain any code words in common.

33. The method of claim 32, wherein the n-bit code words are divided into r1 coding states of the first kind, r2 coding states of the second kind and r3 coding states of the third kind, where r1, r2 and r3 are integers greater than or equal to 1, and each of the r1, r2 and r3 coding states have n-bit code words different from the n-bit code words in the other r1, r2 and r3 coding states.

34. The method of claim 33, wherein the converting step determines to which of the p and q coding states a next n-bit code word belongs, and converts a current n-bit code word into an m-bit information word based on the determined coding state.

35. The method of claim 34, wherein at least one of the r1, r2 and r3 coding states includes more than one of a same n-bit code word, the same n-bit code word maps to more than one of the m-bit information words, and each same n-bit code word has a different state direction associated therewith, each state direction indicating a next one of the r1, r2 and r3 coding states from which to obtain the next n-bit code word when converting the m-bit information words into the n-bit code words.

36. The method of claim 35, wherein the n-bit code words satisfy a dk-constraint, where d indicates a minimum number of zeros between consecutive ones in the n-bit code words and k indicates a maximum number of zeros between consecutive ones in the n-bit code words.

37. The method of claim 36, wherein m/n is greater than ½, and d=2.

38. The method of claim 37, wherein r1+r2+r3 equals 9.

39. The method of claim 36, wherein the n-bit code words of the first type end in "00", the n-bit code words of the second type end in "10" and the n-bit code words of the third type end in "01".

40. The method of claim 39, wherein the n-bit code words in a coding state of the first kind start with "00", the n-bit code words in a coding state of the second kind start with "00", "01" or "10", and the n-bit code words in a coding state of the third kind start with "00" or "01".

41. The method of claim 32, further comprising:
receiving a modulated signal; and
demodulating the modulated signal into at least the n-bit code words.

42. The method of claim 32, further comprising:
reproducing a modulated signal from a recording medium; and
demodulating the modulated signal into at least the n-bit code words.

43. A decoding device, comprising:
a converter receiving n-bit code words, where n is an integer, and converting the n-bit code words into m-bit information words, where m is an integer less than n, the n-bit code words being divided into a first type, a second type and a third type and into coding states of a first kind, a second kind and a third kind such that an m-bit information word is converted into an n-bit code word of the first, second or third kind if the previous m-bit information word was converted into an n-bit code word of the first type and is converted into an n-bit code word of the first or third kind, if the previous m-bit information word was converted into an n-bit code word of the second type and is converted into an n-bit code word of the first kind, if the previous m-bit information word was converted into an n-bit code word of the third type, wherein sets of code words belonging to the different coding states do not contain any code words in common.

44. The decoding device of claim 43, wherein the n-bit code words are divided into r1 coding states of the first kind, r2 coding states of the second kind and r3 coding states of the third kind, where r1, r2 and r3 are integers greater than or equal to 1, and each of the r1, r2 and r3 coding states have n-bit code words different from the n-bit code words in the other r1, r2 and r3 coding states.

45. The decoding device of claim 44, wherein the converter determines to which of the r1, r2 and r3 coding states a next n-bit code word belongs, and converts a current n-bit code word into an m-bit information word based on the determined coding state.

46. The decoding device of claim 45, wherein at least one of the r1, r2 and r3 coding states includes more than one of a same n-bit code word, the same n-bit code word maps to more than one of the m-bit information words, and each same n-bit code word has a different state direction associated therewith, each state direction indicating a next one of the r1, r2 and r3 coding states from which to obtain the next n-bit code word when converting the m-bit information words into the n-bit code words.

47. The decoding device of claim 46, wherein the n-bit code words satisfy a dk-constraint, where d indicates a minimum number of zeros between consecutive ones in the n-bit code words and k indicates a maximum number of zeros between consecutive ones in the n-bit code words.

48. The decoding device of claim 47, wherein m/n is greater than ½, and d=2.

49. The decoding device of claim 48, wherein r1+r2+r3 equals 9.

50. The decoding device of claim 49, wherein the n-bit code words of the first type end in "00", the n-bit code words of the second type end in "10" and the n-bit code words of the third type end in "01".

51. The decoding device of claim 50, wherein the n-bit code words in a coding state of the first kind start with "00", the n-bit code words in a coding state of the second kind start with "00", "01" or "10", and the n-bit code words in a coding state of the third kind start with "00" or "01".

52. The decoding device of claim 43, further comprising:
a demodulator receiving a modulated signal and demodulating the modulated signal into at least the n-bit code words.

53. The decoding device of claim 43, further comprising:
a reproducing device reproducing a modulated signal from a recording medium, and demodulating the modulated signal into at least the n-bit code words.

* * * * *